(12) United States Patent
Kang

(10) Patent No.: US 11,264,426 B2
(45) Date of Patent: Mar. 1, 2022

(54) IMAGE SENSOR FOR DETECTING INFRARED MULTI-BAND, AND ELECTRONIC DEVICE USING SAME

(71) Applicant: Samsung Electronics Co., Ltd., Gyeonggi-do (KR)

(72) Inventor: Hwa-Young Kang, Gyeonggi-do (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/757,889

(22) PCT Filed: Sep. 28, 2018

(86) PCT No.: PCT/KR2018/011555
§ 371 (c)(1),
(2) Date: Apr. 21, 2020

(87) PCT Pub. No.: WO2019/083180
PCT Pub. Date: May 2, 2019

(65) Prior Publication Data
US 2020/0343295 A1 Oct. 29, 2020

(30) Foreign Application Priority Data
Oct. 23, 2017 (KR) .......................... 10-2017-0137491

(51) Int. Cl.
*H01L 27/146* (2006.01)
(52) U.S. Cl.
CPC .............................. *H01L 27/14652* (2013.01)
(58) Field of Classification Search
CPC .......... H01L 27/14652; H04N 9/04553; H04N 5/2257; H04N 5/33
See application file for complete search history.

(56) References Cited

U.S. PATENT DOCUMENTS 5,258,618 A * 11/1993 Noble ....................... G01J 5/08
250/332
7,217,913 B2 * 5/2007 Fouquet .................... G01J 3/10
250/214 R
(Continued)

FOREIGN PATENT DOCUMENTS

| JP | 2013045917 | 3/2013 |
| KR | 1020160003696 | 1/2011 |
| KR | 1020160091586 | 8/2016 |

OTHER PUBLICATIONS

PCT/ISA/210 Search Report dated Jan. 11, 2019 issued on PCT/KR2018/011555, pp. 5.

*Primary Examiner* — Christine S. Kim
(74) *Attorney, Agent, or Firm* — The Farrell Law Firm, P.C.

(57) ABSTRACT

The embodiments disclosed in the present document relate to an image sensor for detecting infrared multi-band light, and an electronic device using same. The image sensor according to the various embodiments of the present invention may comprise: a first filter configured to allow light in the infrared band to pass; a pixel array comprising a first pixel configured to be able to at least detect light of a first band which corresponds to part of the light in the infrared band that passed through the first filter, and a second pixel configured to be able to at least detect light of a second band which corresponds to another part of the light in the infrared band that passed through the first filter; and a second filter provided on top of the first pixel, for lowering electrical reactivity of the first pixel towards light in a band other than the first band.

13 Claims, 18 Drawing Sheets

(56) References Cited

U.S. PATENT DOCUMENTS

| | | |
|---|---|---|
| 2011/0001205 A1 | 1/2011 | Sul et al. |
| 2013/0016203 A1* | 1/2013 | Saylor ................ G06K 9/00604 |
| | | 348/78 |
| 2013/0050562 A1 | 2/2013 | Nakata |
| 2013/0077958 A1 | 3/2013 | Xu et al. |
| 2016/0163760 A1 | 6/2016 | Tsai et al. |
| 2017/0243075 A1 | 8/2017 | Hanna |
| 2018/0025210 A1* | 1/2018 | Remiszewski ......... G06K 9/685 |
| | | 382/133 |

* cited by examiner

IMAGE SENSOR FOR DETECTING INFRARED MULTI-BAND, AND ELECTRONIC DEVICE USING SAME

PRIORITY

This application is a National Phase Entry of International Application No. PCT/KR2018/011555, which was filed on Sep. 28, 2018, and claims priority to Korean Patent Application No. 10-2017-0137491 filed in the Korean Intellectual Property Office on Oct. 23, 2017, the content of each of which is incorporated herein by reference.

TECHNICAL FIELD

The disclosure relates to an image sensor for detecting infrared multi-band light and an electronic device using the same.

BACKGROUND ART

With the improvement in performance of electronic devices, various services and additional functions provided through the electronic devices have gradually expanded. Further, to increase effective value of the electronic devices and satisfy various demands of users, various applications executable in the electronic devices have been developed.

Some of the applications are relevant to camera functions, and an individual user can photograph himself/herself or backgrounds using a camera module mounted in the electronic device. The camera module provided in the electronic device to obtain an image may generally include a lens for condensing light, photodiodes that convert the condensed light into electric signals, and an analog-to-digital converter (ADC) that converts the analog electric signals into digital electric signals. Meanwhile, a process of the camera module converting the electric signals from the plurality of photodiodes into the digital electric signals and outputting the digital electric signals may be referred to as readout.

DETAILED DESCRIPTION OF THE INVENTION

Technical Problem

Light of infrared bands rather than visible light is mainly used for camera modules used for biometric identification or vision recognition. For example, camera modules used for iris recognition recognize an iris of a user using light having a wavelength of about 850 nm. Further, camera modules required to recognize a subject while avoiding noises caused by natural light of an outdoor environment recognize the subject using light having a wavelength of about 940 nm.

Meanwhile, since the camera modules using the light of the infrared bands can recognize a subject by effectively using light of a preset specific band, efficiency thereof is reduced when used for recognizing the subject using light of another band. For example, when the camera modules that recognize the iris of the user using the light having a wavelength of about 850 nm are used for recognizing a subject using the light having a wavelength of about 940 nm, efficiency thereof is reduced.

Thus, to perform functions for which light of bands different from one another is used, such as an iris recognition function and a depth measurement function, in one electronic device, the electronic device should be provided with at least two camera modules specialized for the wavelength bands. In this way, in the case where the electronic device is provided with a plurality of camera modules, the electronic device may be restricted by a design. Further, due to the plurality of camera modules provided on the electronic device, a manufacturing cost may be raised, and power consumption and complication of a manufacturing process may be increased.

The disclosure was made in view of the above circumstances, and an image sensor according to various embodiments includes a plurality of pixels capable of detecting light of an infrared multi-band to be able to selectively detect the light of the infrared multi-band.

Technical Solution

An image sensor according to various embodiments of the disclosure includes: a first filter configured to pass light of an infrared band; a pixel array including first pixels configured to be able to detect light of at least a first band corresponding to some of the light of the infrared band passing the first filter, and second pixels configured to be able to detect light of at least a second band corresponding to the other of the light of the infrared band passing the first filter; and a second filter configured to reduce electrical reactivity of the first pixels to light of a band other than the first band, and provided above the first pixels.

An electronic device or a camera module according to various embodiments of the disclosure includes: at least one lens; an image sensor that includes a first filter configured to pass light of an infrared band among light obtained via the at least one lens, first pixels configured to be able to detect light of at least a first band corresponding to some of the light of the infrared band passing the first filter, second pixels configured to be able to detect light of at least a second band corresponding to the other of the light of the infrared band passing the first filter, and a second filter configured to reduce electrical reactivity of the first pixels to light of a band other than the first band, and provided above the first pixels; and a processor electrically connected to the image sensor. The processor is configured to identify a mode related to capturing of an external object of the electronic device, to obtain first data that corresponds to the external object using at least the first pixels on the basis of the fact that the identified mode is a first mode, and to obtain second data that corresponds to the external object using at least the second pixels on the basis of the fact that the identified mode is a second mode.

Advantageous Effects

The electronic device with the image sensor according to an embodiment of the disclosure can detect an infrared multi-band via one camera module.

Further, since the electronic device according to an embodiment of the disclosure can perform a plurality of functions via one camera module, a degree of freedom in design is high, material costs can be reduced, power consumption can be reduced, and a manufacturing process can be simplified.

BRIEF DESCRIPTION OF DRAWINGS

FIGS. 9A and 9B are diagrams illustrating a method of obtaining a high-resolution image using the image sensor of the electronic device according to various embodiments.

Figures 11A, 11B:
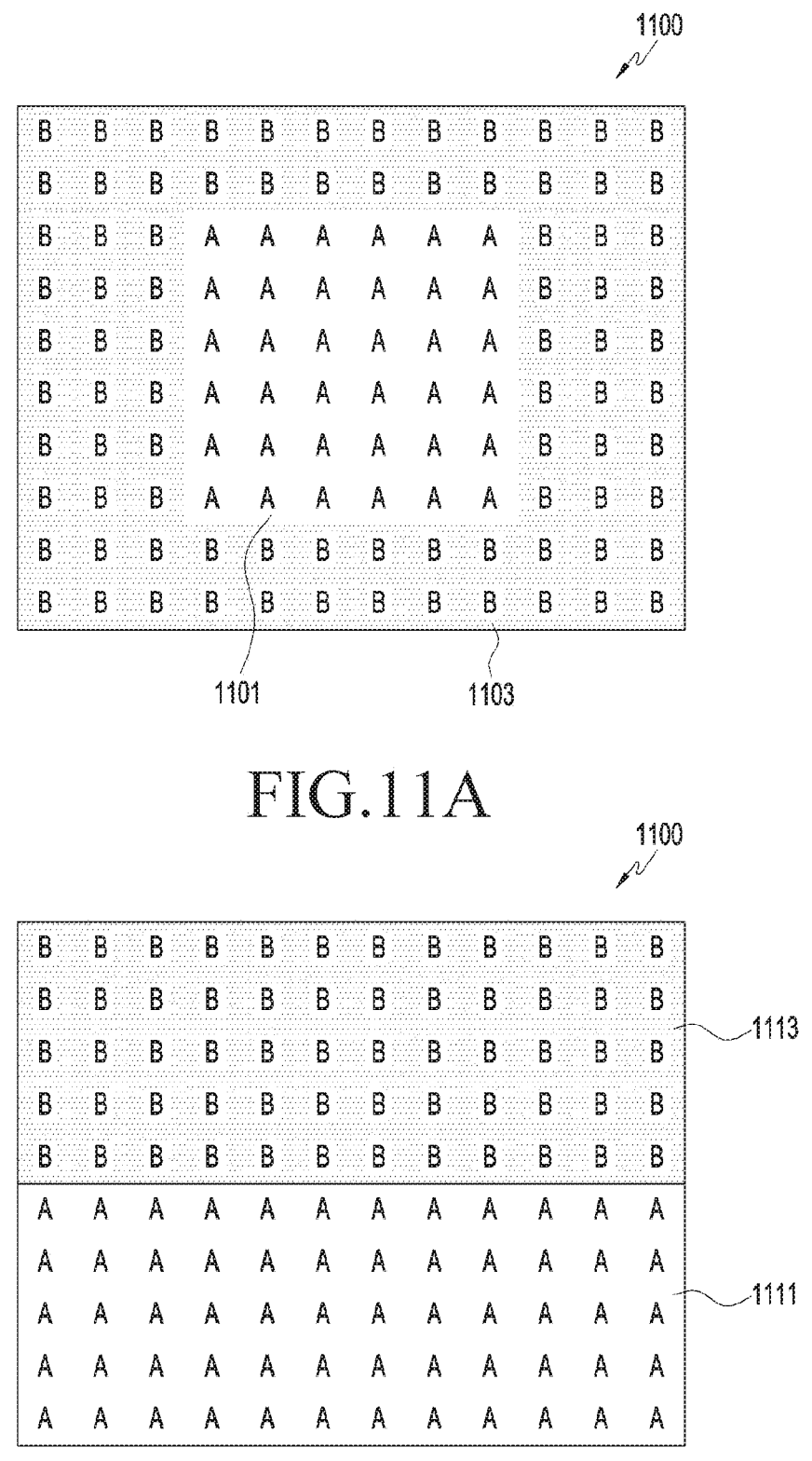
Figures 11C, 11D:
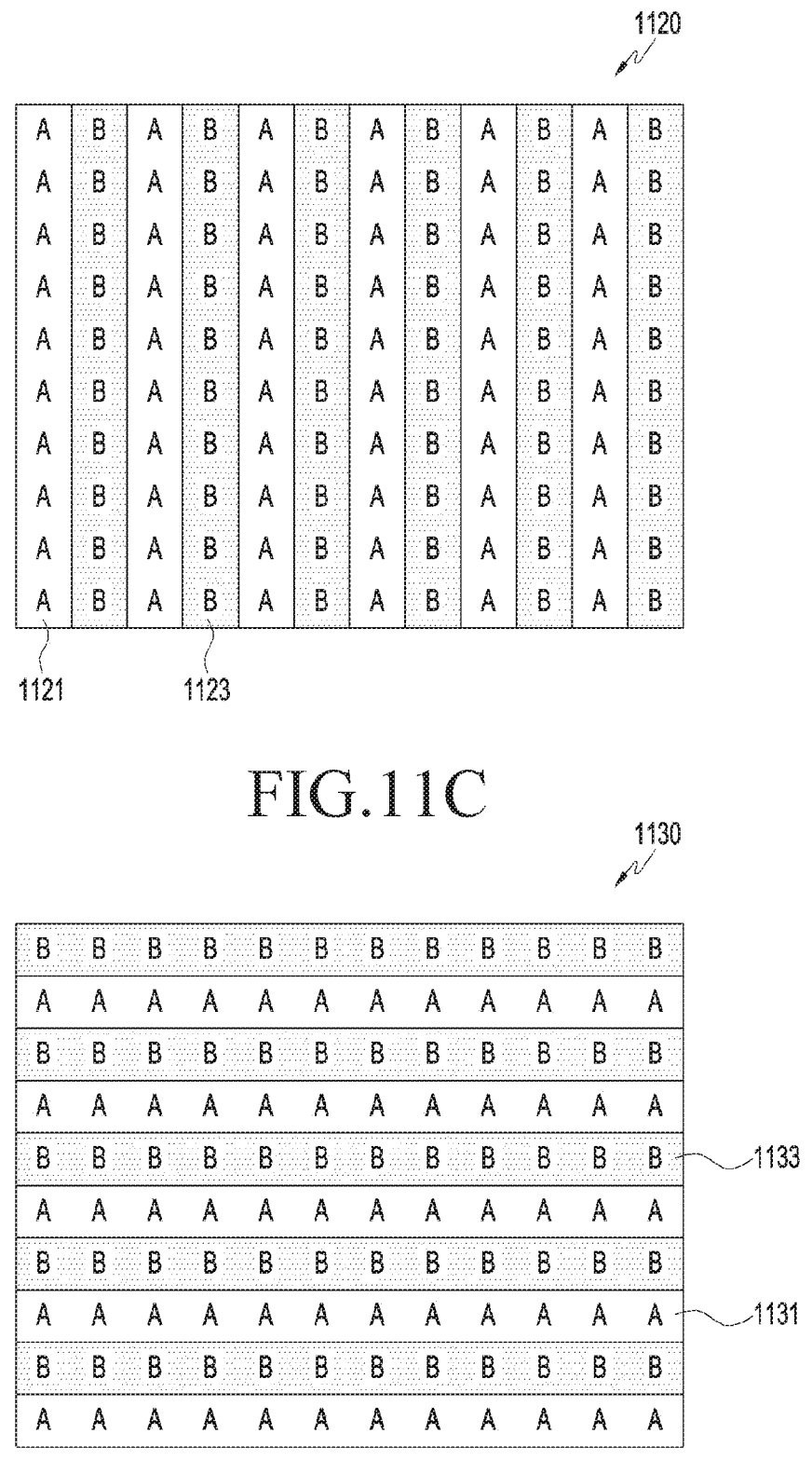

FIGS. 11A to 11F are diagrams illustrating a structure of the pixel array included in the image sensor of the electronic device according to various embodiments.

MODE FOR CARRYING OUT THE INVENTION

Hereinafter, various embodiments of the disclosure will be described with reference to the attached drawings.

Figure 1:
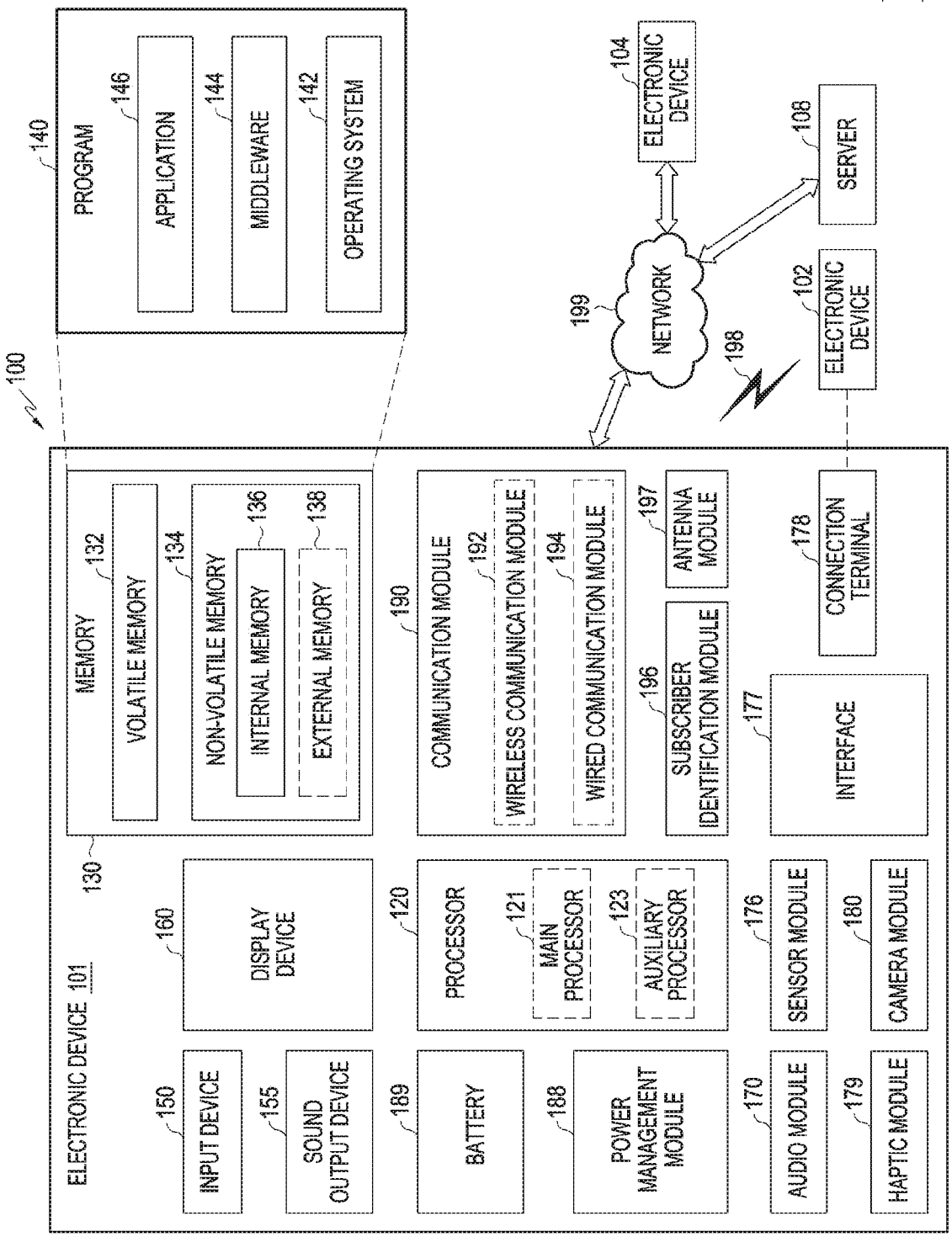
FIG. 1 is a block diagram illustrating an electronic device 101 in a network environment 100 according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, and an antenna module 197. In some embodiments, at least one (e.g., the display device 160 or the camera module 180) of the components may be omitted from the electronic device 101, or one or more other components may be added to the electronic device 101. In some embodiments, some of the components may be implemented by integration, for example, as in the case of the sensor module 176 (e.g., a fingerprint sensor, an iris sensor, or an illuminance sensor) embedded in the display device 160 (e.g., a display).

The processor 120 may execute, for example, software (e.g., a program 140) to control at least one other component (e.g., a hardware or software component) of the electronic device 101 connected to the processor 120, and may perform various data processing or computation. The processor 120 may load a command or data received from another component (e.g., the sensor module 176 or the communication module 190) into a volatile memory 132, process the command or the data loaded into the volatile memory 132, and store resultant data in a non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operated independently of the main processor 121. Additionally or alternatively, the auxiliary processor 123 may consume less power than the main processor 121 or be specialized for a specified function. Here, the auxiliary processor 123 may be operated separately from or embedded in the main processor 121.

In this case, the auxiliary processor 123 may control at least some functions or states related to at least one component (e.g., the display device 160, the sensor module 176, or the communication module 190) among the components of the electronic device 101, instead of the main processor 121 while the main processor 121 is in an inactive state (e.g., a sleep state), or along with the main processor 121 while the main processor 121 is in an active state (e.g., executing an application). According to an embodiment, the auxiliary processor 123 (e.g., an image signal processor or a communication processor) may be implemented as a part of another component (e.g., the camera module 180 or the communication module 190) related functionally to the auxiliary processor 123. The memory 130 may store various data used by at least one component (e.g., the processor 120 or the sensor module 176) of the electronic device 101. The various data may include, for example, software (e.g., the program 140) and input data or output data for a command related to the software. The memory 130 may include the volatile memory 132 or the non-volatile memory 134.

The program 140 may be software stored in the memory 130, and may include, for example, an operating system (OS) 142, middleware 144, or an application 146.

The input device 150 may receive a command or data, which is to be used in the component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker that is used for general purposes such as multimedia playing or record playing, and a receiver that is only used for taking a call. According to an embodiment, the receiver may be implemented integrally with or separately from the speaker.

The display device 160 may visually provide information to a user of the electronic device 101. The display device 160 may include, for example, a display, a hologram device, or a projector, and control circuitry that controls one corresponding to the display, the hologram device, or the projector. According to an embodiment, the display device 160 may include touch circuitry, or a pressure sensor capable of measuring an intensity of a pressure caused by a touch.

The audio module 170 may convert a sound into an electrical signal and vice versa. According to an embodiment, the audio module 170 may obtain a sound via the input device 150, or output a sound via the sound output device 155 or an external electronic device (e.g., the electronic device 102 (e.g., a speaker or a headphone)) that is wired or wirelessly connected to the electronic device 101.

The sensor module 176 may produce an electrical signal or data value corresponding to an operational state (e.g., power or temperature) inside the electronic device 101 or an environmental state outside the electronic device 101. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support a specified protocol that is wired or wirelessly connected to an external electronic device (e.g., the electronic device 102). According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 can be physically connected to an external electronic device (e.g., the electronic device 102), for example, a HDMI connector, a USB connector, a SD card connector, or an audio connector (e.g., a headphone connector).

The haptic module 179 may convert an electrical signal into a mechanical stimulus (e.g., a vibration or a movement) or an electrical stimulus which can be recognized by a user via a tactile sensation or a kinesthetic sensation. The haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. The power management module 188 may be implemented as at least apart of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a wired or wireless communication channel between the electronic device 101 and the external electronic device (e.g., the electronic device 102, the electronic device 104, or the server 108), and performing communication via the established communication channel. The communication module 190 may include one or more communication processors that are operated independently of the processor 120 (e.g., the application processor (AP)) and supports wired communication or wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). One of these communication modules may communicate with the external electronic device via the first network 198 (e.g., a short-range communication network such as Bluetooth, wireless-fidelity (Wi-Fi) direct, or infrared data association (IrDA)) or the second network 199 (e.g., a long-range communication network such as a cellular network, the Internet, or a computer network (e.g., a LAN or a wide area network (WAN)). These various types of communication modules 190 may be implemented as a single chip or individual chips.

According to an embodiment, the wireless communication module 192 may identify and authenticate the electronic device 101 in a communication network using subscriber information stored in the subscriber identification module 196.

The antenna module 197 may include one or more antennas that transmit or receive a signal or a power to or from the outside of the electronic device 101. According to an embodiment, the communication module 190 (e.g., the wireless communication module 192) may transmit or receive a signal to or from the external electronic device via an antenna suitable for a communication scheme.

Some of the above-described components may be mutually connected via an inter-peripheral communication scheme (e.g., a bus, general purpose input and output (GPIO), serial peripheral interface (SPI), or mobile industry processor interface (MIPI)), and communicate signals (e.g., commands or data) therebetween.

According to an embodiment, commands or data may be transmitted or received between the electronic device 101 and the external electronic device 104 via the server 108 connected to the second network 199. Each of the electronic devices 102 and 104 may be a device of a type identical to or different from the electronic device 101. According to an embodiment, all or some of the operations to be executed at the electronic device 101 may be executed at one or more external electronic devices. According to an embodiment, if the electronic device 101 should perform a function or a service automatically or in response to a request, the electronic device 101, instead of or in addition to executing the function or the service, may request the external electronic device to perform at least some functions related to the function or the service. The external electronic device receiving the request may perform the requested functions or additional or an additional function, and transfer an outcome of the performance to the electronic device 101. The electronic device 101 may process the received outcome without a change or may additionally process the received outcome, and provide the requested function or service. To this end, for example, cloud computing, distributed computing, or client-server computing technology may be used.

Figure 2:
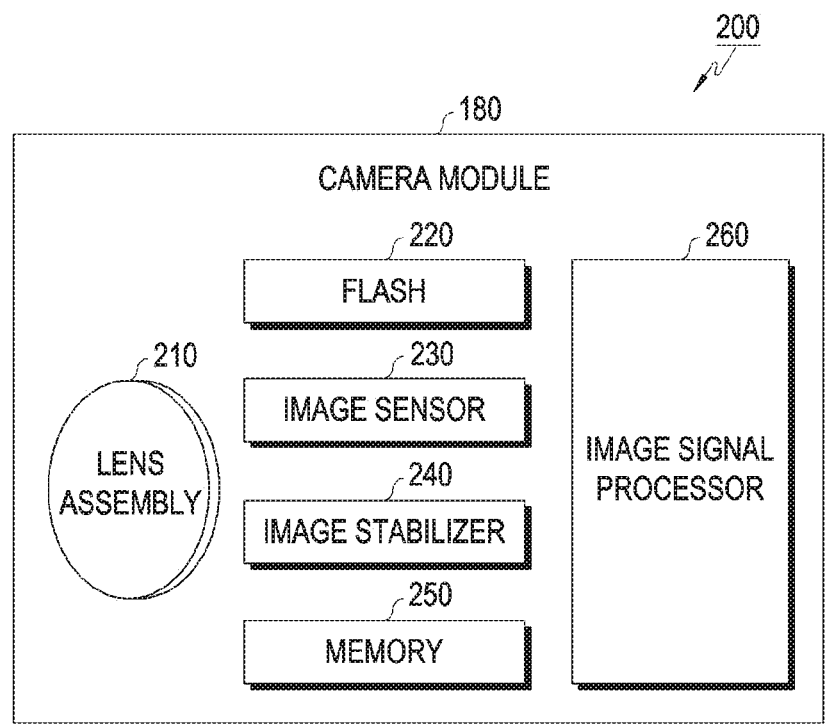
FIG. 2 is a block diagram 200 illustrating the camera module 180 according to various embodiments.

FIG. 2 is a block diagram 200 illustrating the camera module 180 according to various embodiments. Referring to FIG. 2, the camera module 180 may include a lens assembly 210, a flash 220, an image sensor 230, an image stabilizer 240, a memory 250 (e.g., a buffer memory), or an image signal processor 260. The lens assembly 210 may collect light emitted from a subject whose image is to be captured. The lens assembly 210 may include one or more lenses. According to an embodiment, the camera module 180 may include a plurality of lens assemblies 210. In this case, the camera module 180 may be, for example, a dual camera, a 360-degree camera, or a spherical camera. The plurality of lens assemblies 210 may have the same lens attribute (e.g., a view angle, a focal length, auto-focusing, an f number, or an optical zoom), or at least one lens assembly may have at least one lens attribute different from that of the other lens assemblies. The lens assembly 210 may include, for example, a wide-angle lens or a telephoto lens. The flash 220 may emit light that is used to reinforce light reflected from a subject. The flash 220 may include one or more light emitting diodes (LEDs) (e.g., a red-green-blue (RGB) LED, a white LED, an infrared (IR) LED, or an ultraviolet (UV) LED) or a xenon lamp.

The image sensor 230 may obtain an image corresponding to a subject by converting light transferred from the subject via the lens assembly 210 into an electrical signal. According to an embodiment, the image sensor 230 may include, for example, one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented as, for example, a charged coupled device (CCD) sensor or a complementary metal oxide semiconductor (CMOS) sensor.

The image stabilizer 240 may move or control (e.g., adjust read-out timing) the image sensor 230 or at least one lens included in the lens assembly 210 in a specific direction in response to the movement of the camera module 180 or the electronic device 101 including the camera module 180 in order to compensate for at least some negative effects (e.g., image blurring) by the movement on an image to be captured. According to an embodiment, the image stabilizer 240 may be implemented as, for example, an optical image stabilizer, and detect such a movement using a gyro sensor (not illustrated) or an acceleration sensor (not illustrated) disposed inside or outside the camera module 180.

The memory 250 may at least temporarily store at least a part of the image obtained via the image sensor 230 for a subsequent image processing task. For example, if image capturing is delayed due to a shutter lag or multiple images are quickly captured, the captured raw image (e.g., a high-resolution image) may be stored in the memory 250, and its corresponding copy image (e.g., a low-resolution image) may be previewed via the display device 160. Afterward, if a specified condition is met (e.g., by a user's input or a system command), at least a part of the raw image stored in the memory 250 may be obtained and processed by, for example, the image signal processor 260. According to an embodiment, the memory 250 may be configured as at least a part of the memory 130 or as a separate memory that is operated independently of the memory 130.

The image signal processor 260 may perform image processing on the image obtained via the image sensor 230 or the image stored in the memory 250. Examples of the image processing may include depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) on at least one (e.g., the image sensor 230) of the components included in the camera module 180. The image processed by the image signal processor 260 may be stored back in the memory 250 for further processing, or be provided to an external component (e.g., the memory 130, the display device 160, the electronic device 102, the electronic device 104, or the server 108) outside the camera module 180. According to an embodiment, the image signal processor 260 may be configured as at least a part of the processor 120, or as a separate processor that is operated independently of the processor 120. If the image signal processor 260 is configured as a separate processor, images processed by the image signal processor 260 may be displayed by the processor 120 via the display device 160 as it is or after being further processed.

According to an embodiment, the electronic device 101 may include a plurality of camera modules 180 having different attributes or functions. In this case, at least one camera module 180 may be, for example, a wide-angle camera or a front camera, and at least one other camera module may be, for example, a telephoto camera or a rear camera.

The electronic device according to various embodiments may be one of various types of electronic devices. The electronic devices may include, for example, at least one of a portable communication device (e.g., a smartphone), a computer device, a portable multimedia device, a portable medical instrument, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to specific embodiments and include various changes, equivalents, and/or replacements of the relevant embodiment. With regard to the description of the drawings, similar reference numerals may be used to refer to similar or related components. It is to be understood that a singular form may include a plural form, unless the relevant context clearly indicates otherwise. As used herein, each of such phrases as "A or B", "at least one of A and/or B", "at least one of A, B or C", and "at least one of A, B, and/or C", may include all possible combinations of the items enumerated together. As used herein, such terms as "1st" and "2nd", or "first" and "second" may be used to qualify the relevant components regardless of the importance or the order and simply distinguish a component from another component, and does not limit the relevant components. It is to be understood that, if a component (e.g., a first component) is referred to, with or without the term "(functionally or communicatively) coupled with", "coupled to", "connected with", or "connected to" another component (e.g., a second component), it means that the component may be directly coupled with the other component, or be coupled with the other component via another component (e.g., a third component).

As used herein, the term "module" may include a unit made up of hardware, software, or firmware, and may be used interchangeably with a term such as logic, a logic block, a part, or circuitry. The module may be an integrated part, or a minimum unit adapted to perform one or more functions or a part thereof. For example, the module may be configured of an application-specific integrated circuit (ASIC).

Various embodiments as set forth herein may be implemented as software (e.g., the program 140) including one or more instructions that are stored in a machine-storage medium (e.g., an internal memory 136 or an external memory 138) that is readable by a machine (e.g., a computer). The machine is a device that invokes an instruction stored in the storage medium and is operable according to the invoked instruction, and may include an electronic device (e.g., the electronic device 101) according to the disclosed embodiments. If the instruction is executed by a processor (e.g., the processor 120), the processor may perform a function corresponding to the instruction using other components directly or under control of the processor. The instruction may include a code produced or executed by a complier or an interpreter. The machine-readable storage medium may be provided in the form of a non-transitory storage medium. Here, the term "non-transitory" simply means that the storage medium is a tangible device, and does not include a signal, but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed online via an application store (e.g., PlayStore™). If the computer program product is distributed online, at least a part of the computer program product may be temporarily produced or at least temporarily stored in the machine-readable storage medium, such as a memory of a manufacturer's server, a server of the application store, or a relay server.

According to various embodiments, each component (e.g., a module or a program) may include a single entity or multiple entities. According to various embodiments, one or more of the above-described sub-components may be omitted, or one or more other components may be added. Alternatively or additionally, one or more components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The image sensor 230 according to various embodiments of the disclosure may include a first filter configured to pass light of an infrared band, a pixel array that includes first pixels which are configured to be able to detect light of at least a first band corresponding to some of the light of the infrared band passing the first filter and second pixels which are configured to be able to detect light of at least a second band corresponding to the other of the light of the infrared band passing the first filter, and a second filter that reduces electrical reactivity of the first pixels to light of a band other than the first band and is provided on the first pixels.

In the image sensor 230 according to various embodiments of the disclosure, the first filter may include at least one band pass filter, and the at least one band pass filter may be configured to reduce electrical reactivity of the first and second pixels to light of a band other than the first or second band.

In the image sensor 230 according to various embodiments of the disclosure, the second filter may include a band pass filter that passes the light of the first band, or a band stop filter that obstructs the light of the second band.

In the image sensor 230 according to various embodiments of the disclosure, the first band may include infrared light having a wavelength of 940 nm, and the second band may include infrared light having a wavelength of 850 nm.

The image sensor 230 according to various embodiments of the disclosure may further include a third filter that reduces the electrical reactivity of the second pixels to the light of the band other than the second band and is provided on the second pixels.

In the image sensor 230 according to various embodiments of the disclosure, the third filter may include a band pass filter that passes the light of the second band, or a band stop filter that obstructs the light of the first band.

The image sensor 230 according to various embodiments of the disclosure may include at least one processor, and the processor may be configured to transmit first data, which is obtained using at least the first pixels, to the external electronic device in response to a signal corresponding to a first mode, and transmit second data, which is obtained using at least the second pixels, to the external electronic device in response to a signal corresponding to a second mode.

In the image sensor 230 according to various embodiments of the disclosure, the first mode may be a mode for obtaining depth information related to at least one object on the basis of the obtained first data, and the second mode may be a mode for obtaining iris information related to at least one object on the basis of the obtained second data.

In the image sensor 230 according to various embodiments of the disclosure, the pixel array may be provided on the image sensor in a grid shape, and the first and second pixels may be alternately arranged on the grid-shaped pixel array.

The electronic device 101 or the camera module 180 according to various embodiments of the disclosure may include: at least one lens; an image sensor that includes a first filter configured to pass light of an infrared band among light obtained via the at least one lens, first pixels that are configured to be able to detect light of at least a first band corresponding to some of the light of the infrared band passing the first filter, second pixels that are configured to be able to detect light of at least a second band corresponding to the other of the light of the infrared band passing the first filter, and a second filter that reduces electrical reactivity of the first pixels to light of a band other than the first band and is provided above the first pixels; and a processor that is electrically connected to the image sensor. The processor may be configured to identify a mode related to capturing of an external object of the electronic device, obtain first data that corresponds to the external object using at least the first pixels on the basis of the fact that the identified mode is a first mode, and obtain second data that corresponds to the external object using at least the second pixels on the basis of the fact that the identified mode is a second mode.

In the electronic device 101 or the camera module 180 according to various embodiments of the disclosure, the first filter may include at least one band pass filter, and the at least one band pass filter may be configured to reduce electrical reactivity of the first and second pixels to the light of the band other than the first or second band.

In the electronic device 101 or the camera module 180 according to various embodiments of the disclosure, the second filter may include a band pass filter that passes the light of the first band, or a band stop filter that obstructs the light of the second band.

In the electronic device 101 or the camera module 180 according to various embodiments of the disclosure, the first band may include infrared light having a wavelength of 940 nm, and the second band may include infrared light having a wavelength of 850 nm.

In the electronic device 101 or the camera module 180 according to various embodiments of the disclosure, the image sensor may further include a third filter that reduces the electrical reactivity of the second pixels to the light of the band other than the second band and is provided on the second pixels.

In the electronic device 101 or the camera module 180 according to various embodiments of the disclosure, the third filter may include a band pass filter that passes the light of the second band, or a band stop filter that obstructs the light of the first band.

In the electronic device 101 or the camera module 180 according to various embodiments of the disclosure, the processor may be configured to perform pixel binning on the obtained first or second data and to obtain information related to the external object using the first or second data on which the pixel binning is performed.

In the electronic device 101 or the camera module 180 according to various embodiments of the disclosure, the processor may be configured to obtain third data that corresponds to the external object using the second pixels on the basis of the fact that the identified mode is the first mode, to perform interpolation computation on the obtained first data on the basis of the obtained third data, and to obtain information related to the external object using the obtained third data and the first data on which the interpolation computation is performed.

In the electronic device 101 or the camera module 180 according to various embodiments of the disclosure, the processor may be configured to obtain third data that corresponds to the external object using the first pixels on the basis of the fact that the identified mode is the second mode, to perform interpolation computation on the obtained second data on the basis of the obtained third data, and to obtain information related to the external object using the obtained third data and the second data on which the interpolation computation is performed.

In the electronic device 101 or the camera module 180 according to various embodiments of the disclosure, the processor may be configured to encode the obtained second data, and to obtain information related to the external object using the encoded second data.

In the electronic device 101 or the camera module 180 according to various embodiments of the disclosure, the first mode is a mode for obtaining depth information related to the external object on the basis of the obtained first data, and the second mode may be a mode for obtaining iris information related to the external object on the basis of the obtained second data.

Figure 3:
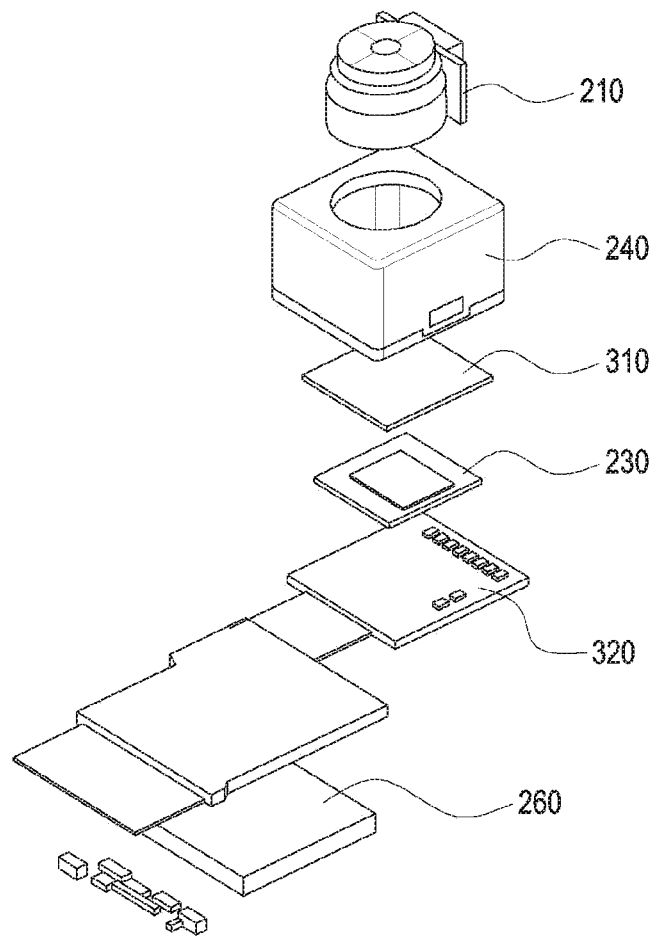
FIG. 3 is a diagram illustrating a structure of the camera module 180 according to various embodiments.

FIG. 3 is a diagram illustrating a structure of the camera module 180 according to various embodiments.

Referring to FIG. 3, the camera module 180 may include at least one of the lens assembly 210, the image stabilizer 240, a filter 310, the image sensor 230, a printed circuit board (PCB) 320, and the image signal processor 260.

The filter 310 may include a band pass filter that passes only light of a specific band, or a band stop filter that obstructs only light of a specific band. According to an embodiment, the filter 310 may be provided below the lens assembly 210, that is, inside the camera module 180. Therefore, at least some of the light passing the lens assembly 210 may be obstructed by the filter 310. For example, in a case where the filter 310 is the band pass filter passing only the light of the infrared band, the filter 310 may pass only the light of the infrared band among the light passing the lens assembly 210. According to an embodiment, the filter 310 may be configured to obstruct visible light and to pass infrared light (whose wavelength is 700 nm or more).

The image sensor 230 may include an analog-to-digital converter (ADC) that converts an analog electric signal into a digital electric signal and outputs the digital electric signal. The image sensor 230 may include a memory (not illustrated) therein, temporarily store the digital electric signal, that is, the data output from the pixels, in the memory included therein, and output the digital electric signal to the external circuitry (e.g., the processor 120 or the memory 130). The image sensor 230 may include an interface used to input/output data, and output the data to the external circuitry according to an output rate of the interface.

The image sensor 230 may include a pixel array made up of a plurality of pixels. The pixel array may include a photodiode that converts light received from the outside into analog electric signals. For example, if the light is received from the outside to the pixel array of the image sensor 230, photoelectric conversion may occur at at least one pixel constituting the pixel array, and the received light may be converted into electric signals by the photoelectric conversion. Meanwhile, a band of the light by which the photoelectric conversion occurs has different ranges according to a material used to manufacture the image sensor 230. According to an embodiment, silicon may be used to manufacture the image sensor 230. The electronic device 101 may convert light transferred from a subject by passing the lens assembly 210 and the filter 310 into electric signals via the image sensor 230, and thereby an image corresponding to the subject may be obtained.

According to an embodiment, the plurality of pixels included in the pixel array of the image sensor 230 may include at least one filter that can obstruct only light of a specific band or pass only light of a specific band. The at least one filter may be mounted on the plurality of pixels included in the pixel array. The at least one filter mounted on the plurality of pixels may transfer only light of a specific wavelength band among the light transferred by passing the lens assembly 210 and the filter 310 to the photodiode, or prevent only the light of the specific wavelength band from being transferred to the photodiode.

The printed circuit board 320 may be electrically connected to the image sensor 230 and the image signal processor 260. Further, the printed circuit board 320 may transmit an electric signal produced at the image sensor 230 to the image signal processor 260.

FIG. 3 is merely one example illustrating the structure of the camera module 180. The components illustrated in FIG. 3 may be combined by various methods, and one or more of the components may be provided on the electronic device.

Figure 4:
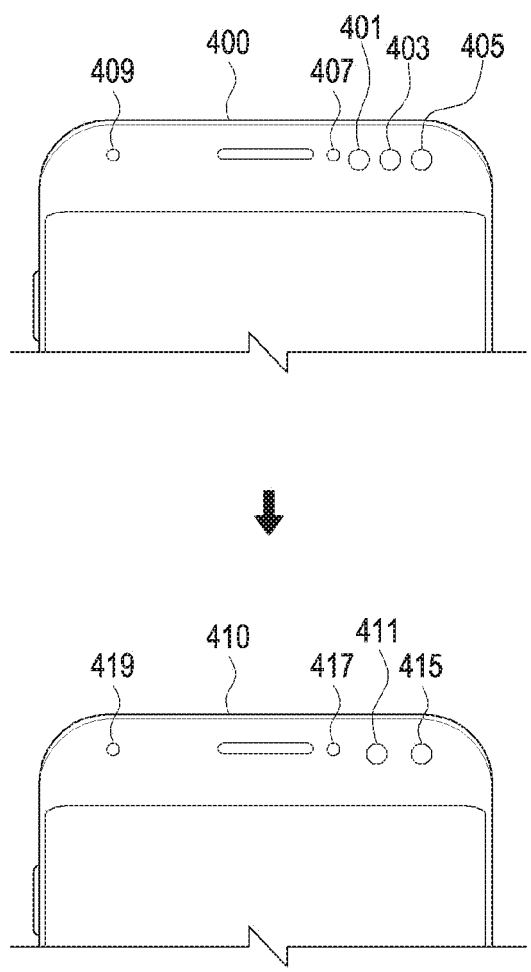
FIG. 4 is a diagram illustrating a structure of the electronic device according to various embodiments.

FIG. 4 is a diagram illustrating a structure of an electronic device according to various embodiments. An electronic device 400 and an electronic device 410 illustrated in FIG. 4 may refer to the electronic device 101 of FIG. 1, and include only some of the components of the electronic device 101.

According to an embodiment, the electronic device 400 may include a camera module 401 that recognizes a subject using light of a first band among infrared light, a camera module 403 that recognizes the subject using light of a second band among the infrared light, a camera module 405 that captures the subject using light of visible light band, an infrared source 407 that outputs the light of the first band among the infrared light, and an infrared source 409 that outputs the light of the second band among the infrared light.

The electronic device 400 may recognize a subject via the camera module 401 using the light of the first band output from the infrared source 407. For example, the electronic device 400 may recognize an iris of a user using infrared light that has a wavelength of 850 nm and is output from the infrared source 407. Further, the electronic device 400 may recognize a subject via the camera module 403 using the light of the second band output from the infrared source 409. For example, the electronic device 400 may obtain depth information from a subject using infrared light that has a wavelength of 940 nm and is output from the infrared source 409.

According to another embodiment, the electronic device 400 may include a camera module 411 that recognizes a subject using the light of the first band or the light of the second band, a camera module 415 that captures the subject using the light of the visible light band, an infrared source 417 that outputs the light of the first band, and an infrared source 419 that outputs the light of the second band.

The electronic device 400 may recognize a subject via the camera module 411 using the light of the first band output from the infrared source 417 or the light of the second band output from the infrared source 419. For example, the electronic device 410 may recognize an iris or obtain depth information from a subject using infrared light that has a wavelength of 850 nm and is output from the infrared source 417 or infrared light that has a wavelength of 940 nm and is output from the infrared source 419.

The various embodiments disclosed herein may be carried out via the electronic device 410 capable of using the light of the multi-band with the single infrared camera, but the disclosure is not limited to the various embodiments. The electronic device 400 or 410 according to various embodiments may include a plurality of visible light camera modules or a plurality of infrared camera modules. Further, the plurality of camera modules may be exposed to the outside through a part of a housing of the electronic device 400 or 410. For example, the plurality of camera modules may be mounted in parts of front and rear surfaces of the electronic device 400 or 410.

Figure 5:
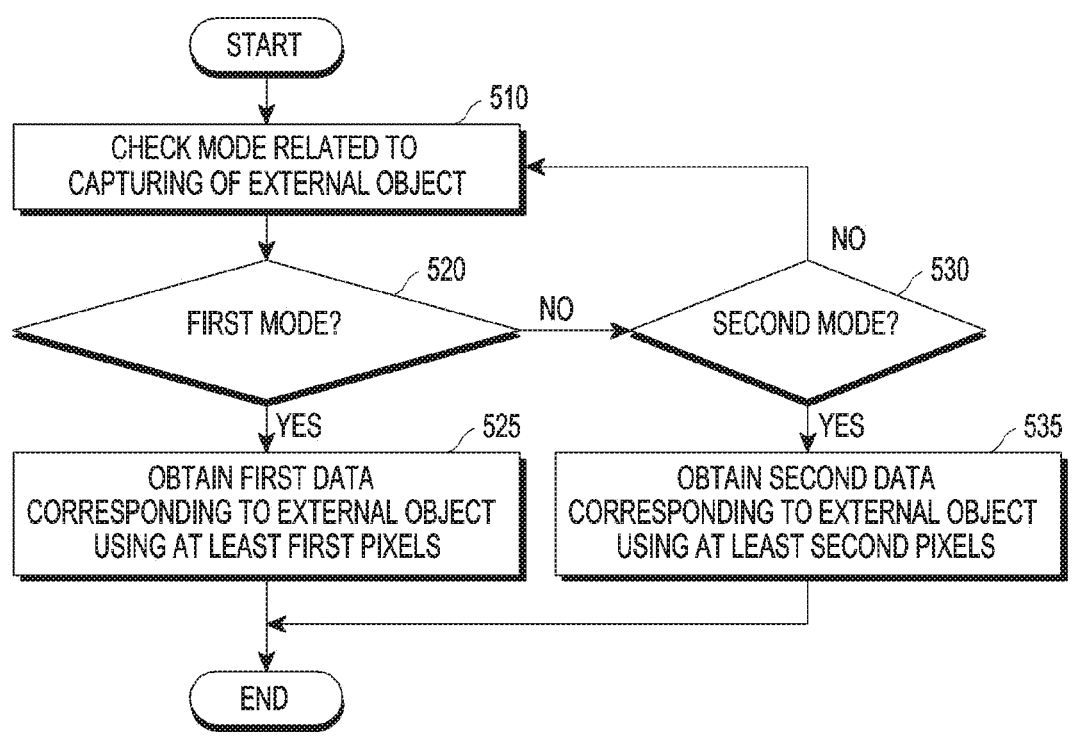
FIG. 5 is a flow chart illustrating a method of obtaining data via at least one camera module provided on the electronic device according to various embodiments.

FIG. 5 is a flow chart illustrating a method of obtaining data via at least one camera module provided on the electronic device according to various embodiments.

In the electronic device 101 that includes the at least one camera module 180 and the processor 120, a subject performing the method may be the processor.

In process 510, the electronic device 101 (e.g., the processor 120) may identify a mode of the electronic device 101. Here, the process of checking the mode may include a process of checking at least one program 140 that is in execution in the electronic device 101 or checking setting of the electronic device 101.

According to an embodiment, the electronic device 101 may execute a program that can obtain depth information, for example, a depth camera application to measure a distance between the electronic device 101 and an outside subject or to recognize movement of the outside subject. If it is determined that the depth camera application is in execution in the electronic device 101, the electronic device 101 may determine that the electronic device 101 is in a first mode.

According to another embodiment, the electronic device 101 may execute a program that can obtain information about the iris of a user, for example, an authentication application to authenticate the user. If it is determined that the authentication application is in execution in the electronic device 101, the electronic device 101 may determine that the electronic device 101 is in a second mode.

In process 520, the electronic device 101 (e.g., the processor 120) may obtain data via at least one of first and second pixels of the image sensor on the basis of the identified mode. For example, the image sensor 230 provided on the camera module 180 of the electronic device 101 may be made up of a pixel array that includes the first pixels capable of detecting the infrared light having a wavelength of 940 nm and the second pixels capable of detecting the infrared light having a wavelength of 850 nm.

According to an embodiment, in the case where it is identified that the electronic device 101 is in the first mode, the electronic device 101 may obtain at least one type of data via the first pixels that can detect the infrared light that has a wavelength of 940 nm and is used to obtain the depth information. For example, the electronic device 101 may measure a distance between the electronic device 101 and a subject or obtain information about movement of the subject using only the infrared light having a wavelength of 940 nm among light transferred from the subject. In this case, the electronic device 101 may control the infrared source 419 provided in the electronic device 101 to output the infrared light having a wavelength of 940 nm toward the subject, and obtain depth information about the subject using this.

According to another embodiment, in the case where it is identified that the electronic device 101 is in the second mode, the electronic device 101 may obtain at least one type of data via the second pixels that can detect the infrared light that has a wavelength of 850 nm and is used to recognize the iris of the user. For example, the electronic device 101 may authenticate the user using only the infrared light having a wavelength of 850 nm among light transferred from the iris of the user. In this case, the electronic device 101 may control the infrared source 417 provided in the electronic device 101 to output the infrared light having a wavelength of 850 nm toward the iris of the user, and recognize the iris of the user using this. Meanwhile, as will be described below using FIG. 9, the electronic device 101 may also use the data obtained via the first pixels to increase accuracy of the iris recognition along with the data obtained via the second pixels.

Further, a band pass filter that passes only light of a first band (e.g., 930 nm to 950 nm) including the infrared light having a wavelength of 940 nm or a band stop filter that can obstruct only light of a second band (e.g., 820 nm to 880 nm) may be provided above the first pixels included in the pixel array of the image sensor 230. Further, a band pass filter that passes only the light of the second band (e.g., 820 nm to 880 nm) including the infrared light having a wavelength of 850 nm or a band stop filter that can obstruct only the light of the first band (e.g., 930 nm to 950 nm) may be provided above the second pixels included in the pixel array of the image sensor 230. A detailed content related to this will be described with reference to the next drawing.

Figure 6:
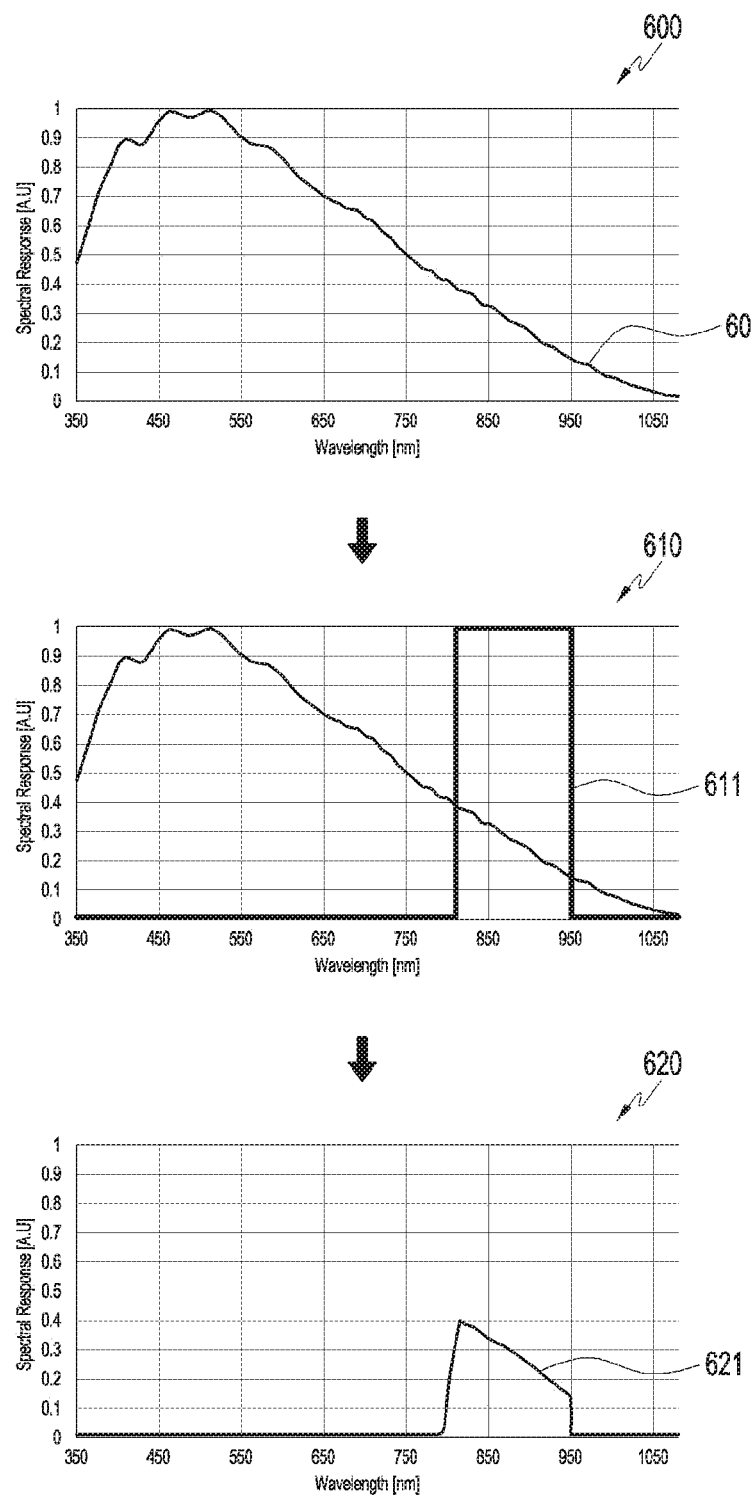
FIG. 6 is a diagram illustrating a method of obtaining light of an infrared band using the camera module of the electronic device according to various embodiments.

FIG. 6 is a diagram illustrating a method of obtaining light of an infrared band using the camera module of the electronic device according to various embodiments.

According to an embodiment, the camera module 180 of the electronic device 101 may include at least one image sensor 230. The image sensor 230 may include an ADC that converts an analog electric signal into a digital electric signal and outputs the digital electric signal. The image sensor 230 may include a memory therein, temporarily store a digital electric signal, that is, data output from pixels, in the memory included therein, and output the digital electric signal to the external circuitry (e.g., the processor 120 or the memory 130). The image sensor 230 may include an interface used to input/output data, and output the data to the external circuitry according to an output rate of the interface. Meanwhile, the camera module 180 may further include a printed circuit board 320 for scanning a pixel array made up of a plurality of pixels.

According to an embodiment, the image sensor 230 may include a pixel array made up of a plurality of pixels. The pixel array may include a photodiode that converts light received from the outside into analog electric signals. For example, if the light is received from the outside to the pixel array of the image sensor 230, photoelectric conversion may occur at at least one pixel constituting the pixel array, and the received light may be converted into electric signals by the photoelectric conversion. Meanwhile, a band of the light by which the photoelectric conversion occurs has different ranges according to a material used to manufacture the image sensor 230. According to an embodiment, silicon may be used to manufacture the image sensor 230. A graph 600 represents light that can be detected by the image sensor 230 formed of silicon. In the case where the image sensor 230 is formed of silicon, the image sensor 230 may detect light 601 of a broadband from visible light to a near-infrared light.

According to an embodiment, the electronic device 101 may include a camera module 411 that recognizes a subject using the light of the infrared band. In this case, the electronic device 101 may include a filter 310 between the lens assembly 210 and the image sensor 230 such that only the light of the infrared band among the light received from the outside via the lens assembly 210 of the camera module 411 can be transferred to the image sensor 230 of the camera module 411. For example, a band pass filter that passes only light of a specific band (e.g., 820 nm to 950 nm) may be provided between the lens assembly 210 and the image sensor 230 of the camera module 411. Referring to a graph 610, the band pass filter 611 can be identified. Further, referring to a graph 620, the light 621 of the specific band passing the band pass filter 611 among the light received from the outside via the lens assembly 210 can be identified.

According to another embodiment, a multi-band pass filter that can pass only light of specific bands may be provided between the lens assembly 210 and the image sensor 230 of the camera module 411. For example, a multi-band pass filter that can pass only light of a first band (e.g., 930 nm to 950 nm) and light of a second (e.g., 820 nm to 880 nm) may be provided on the camera module 411.

Meanwhile, note that numerical values presented in FIG. 6 are merely examples presented to easily illustrate the disclosure and are not presented to limit functions of the components of the disclosure as specific numerical values.

Figure 7A:
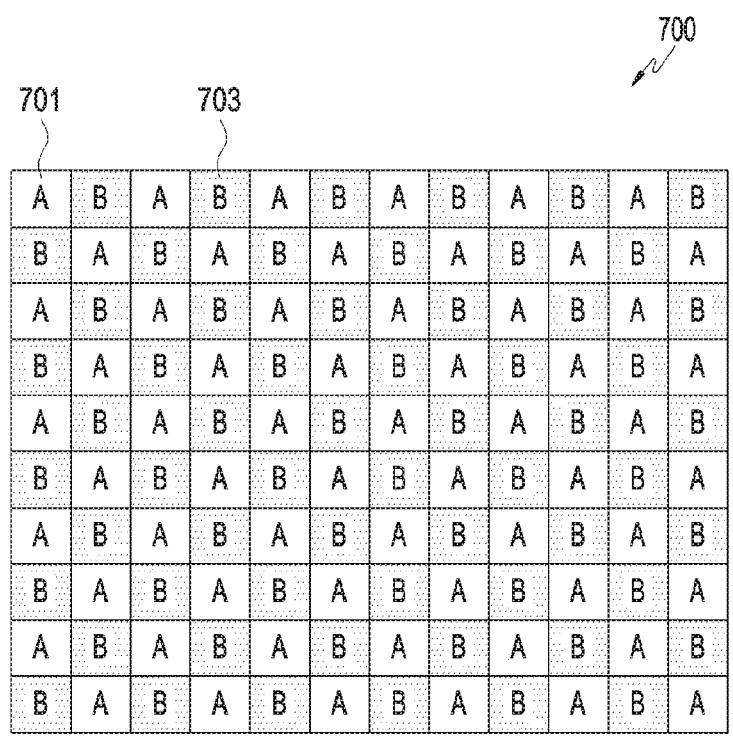
FIGS. 7A to 7C are diagrams illustrating a structure of a pixel array included in an image sensor of the electronic device according to various embodiments.
Figure 7B:
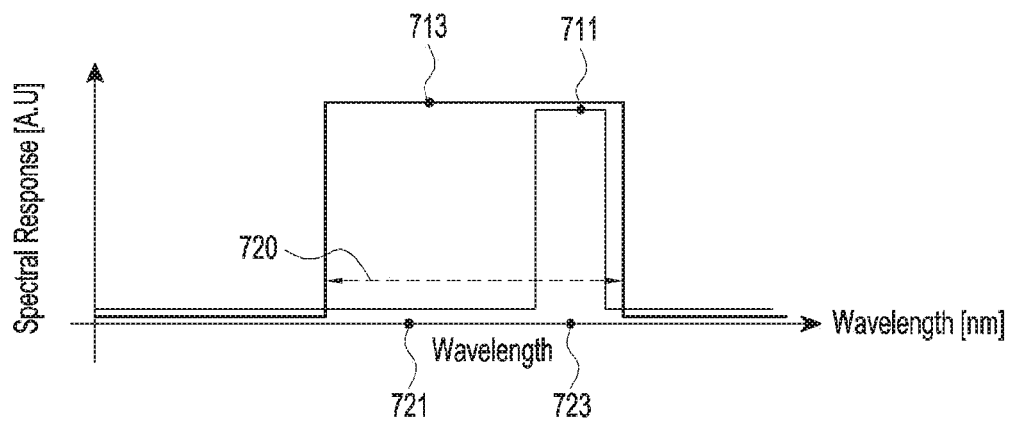
Figure 7C:
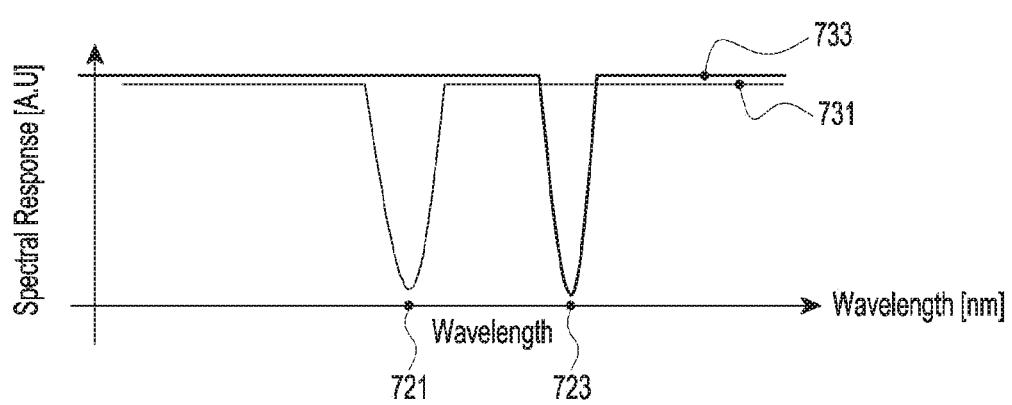

FIGS. 7A to 7C are diagrams illustrating a structure of a pixel array included in an image sensor of the electronic device according to various embodiments.

Referring to FIG. 7A, the electronic device 101 may include at least one image sensor 230. The image sensor 230 may include a pixel array 700 made up of a plurality of pixels 701 and 703.

According to an embodiment, the first pixels 701 constituting the pixel array 700 may be used to detect infrared light having a wavelength of 940 nm. For example, if the infrared light having a wavelength of 940 nm is received to the pixel array 700 of the image sensor 230, photoelectric conversion occurs at the first pixels 701, and thereby the received light may be converted into an electric signal. The electronic device 101 may obtain depth information about a subject, for example measure a distance between the electronic device 101 and the subject or obtain information about movement of the subject, on the basis of the electric signal produced via the first pixels 701.

To this end, a band pass filter that passes only light of a first band (e.g., 930 nm to 950 nm) including the infrared light having a wavelength of 940 nm or a band stop filter that can obstruct only light of a second band (e.g., 820 nm to 880 nm) may be provided above the first pixels 701.

For example, light passing the filter 310 provided between the lens assembly 210 and the image sensor 230 among light received from the outside via the lens assembly 210 of the camera module 411 may be light of a specific band (e.g., 820 nm to 950 nm). In this case, if the band pass filter that passes only the light of the first band (e.g., 930 nm to 950 nm) is provided above the first pixels 701 of the image sensor 230, the electronic device 101 may detect the infrared light having a wavelength of 940 nm via the first pixels 701.

Further, the light passing the filter 310 provided between the lens assembly 210 and the image sensor 230 among the light received from the outside via the lens assembly 210 of the camera module 411 may be the light of the first band (e.g., 930 nm to 950 nm) and the second band (e.g., 820 nm to 880 nm). In this case, if the band pass filter that passes only the light of the first band (e.g., 930 nm to 950 nm) or the band stop filter that can obstruct only the light of the second band (e.g., 820 nm to 880 nm) may be provided above the first pixels 701 of the image sensor 230, the electronic device 101 may detect the infrared light having a wavelength of 940 nm via the first pixels 701.

According to another embodiment, the second pixels 703 constituting the pixel array 700 may be used to detect infrared light having a wavelength of 850 nm. For example, if the infrared light having a wavelength of 850 nm is received to the pixel array 700 of the image sensor 230, photoelectric conversion occurs at the second pixels 703, and thereby the received light may be converted into an electric signal. The electronic device 101 may obtain information about the iris of a user on the basis of the electric signal produced via the second pixels 703.

To this end, a band pass filter that passes only the light of the second band (e.g., 820 nm to 880 nm) including the infrared light having a wavelength of 850 nm or a band stop filter that can obstruct only the light of the first band (e.g., 930 nm to 950 nm) may be provided above the second pixels 703.

For example, the light passing the filter 310 provided between the lens assembly 210 and the image sensor 230 among the light received from the outside via the lens assembly 210 of the camera module 411 may be light of a specific band (e.g., 820 nm to 950 nm). In this case, if the band pass filter that passes only the light of the second band (e.g., 820 nm to 880 nm) is provided above the second pixels 703 of the image sensor 230, the electronic device 101 may detect the infrared light having a wavelength of 850 nm via the second pixels 703.

Further, the light passing the filter 310 provided between the lens assembly 210 and the image sensor 230 among the light received from the outside via the lens assembly 210 of the camera module 411 may be the light of the first band (e.g., 930 nm to 950 nm) and the second band (e.g., 820 nm to 880 nm). In this case, if the band pass filter that passes only the light of the second band (e.g., 820 nm to 880 nm) or the band stop filter that can obstruct only the light of the first band (e.g., 930 nm to 950 nm) may be provided above the first pixels 701 of the image sensor 230, the electronic device 101 may detect the infrared light having a wavelength of 850 nm via the second pixels 703.

According to another embodiment, the first pixels 701 constituting the pixel array 700 may be used to detect the infrared light having a wavelength of 940 nm, and the second pixels 703 may be used to detect all the light of the specific band (e.g., 820 nm to 950 nm). For example, the light passing the filter 310 provided between the lens assembly 210 and the image sensor 230 among the light received from the outside via the lens assembly 210 of the camera module 411 may be light of a specific band (e.g., 820 nm to 950 nm). If the band pass filter that passes only the light of the first band (e.g., 930 nm to 950 nm) is provided above the first pixels 701, the electronic device 101 may detect the infrared light having a wavelength of 940 nm via the first pixels 701. In contrast, if neither the band pass filter nor the band stop filter is designed to be provided above the second pixels 703, the electronic device 101 may detect all the light of the specific band (e.g., 820 nm to 950 nm) via the second pixels 703

Spectral responses to the first and second pixels 701 and 703 are illustrated in FIG. 7B. For example, if the band pass filter that passes only the light of the first band (e.g., 930 nm to 950 nm) including infrared light 723 having a wavelength of 940 nm is provided above the first pixels 701, a spectral response such as a response 711 may occur. In contrast, if neither the band pass filter nor the band stop filter is designed to be provided above the second pixels 703, a spectral response such as a response 713 may occur. The response 713 is based on light that pass at least one infrared filter (e.g., 310 of FIG. 3) between the lens assembly 210 and the image sensor 230 among the light received from the outside via the lens assembly 210 of the camera module 411, or the light of a specific band 720 (e.g., 820 nm to 950 nm). According to an embodiment, infrared light 721 having a wavelength of 850 nm and the infrared light 723 having a wavelength of 940 nm may be included in the specific band 720.

The spectral responses to the first and second pixels 701 and 703 are illustrated in FIG. 7C. For example, if the band stop filter that can obstruct the light of the second band (e.g., 820 nm to 880 nm) including the infrared light 721 having a wavelength of 850 nm is provided above the first pixels 701, a spectral response such as a response 731 may occur. Further, if the band stop filter that can obstruct the light of the first band (e.g., 930 nm to 950 nm) including the infrared light 723 having a wavelength of 940 nm is provided above the second pixels 703, a spectral response such as a response 733 may occur.

Figure 8A:
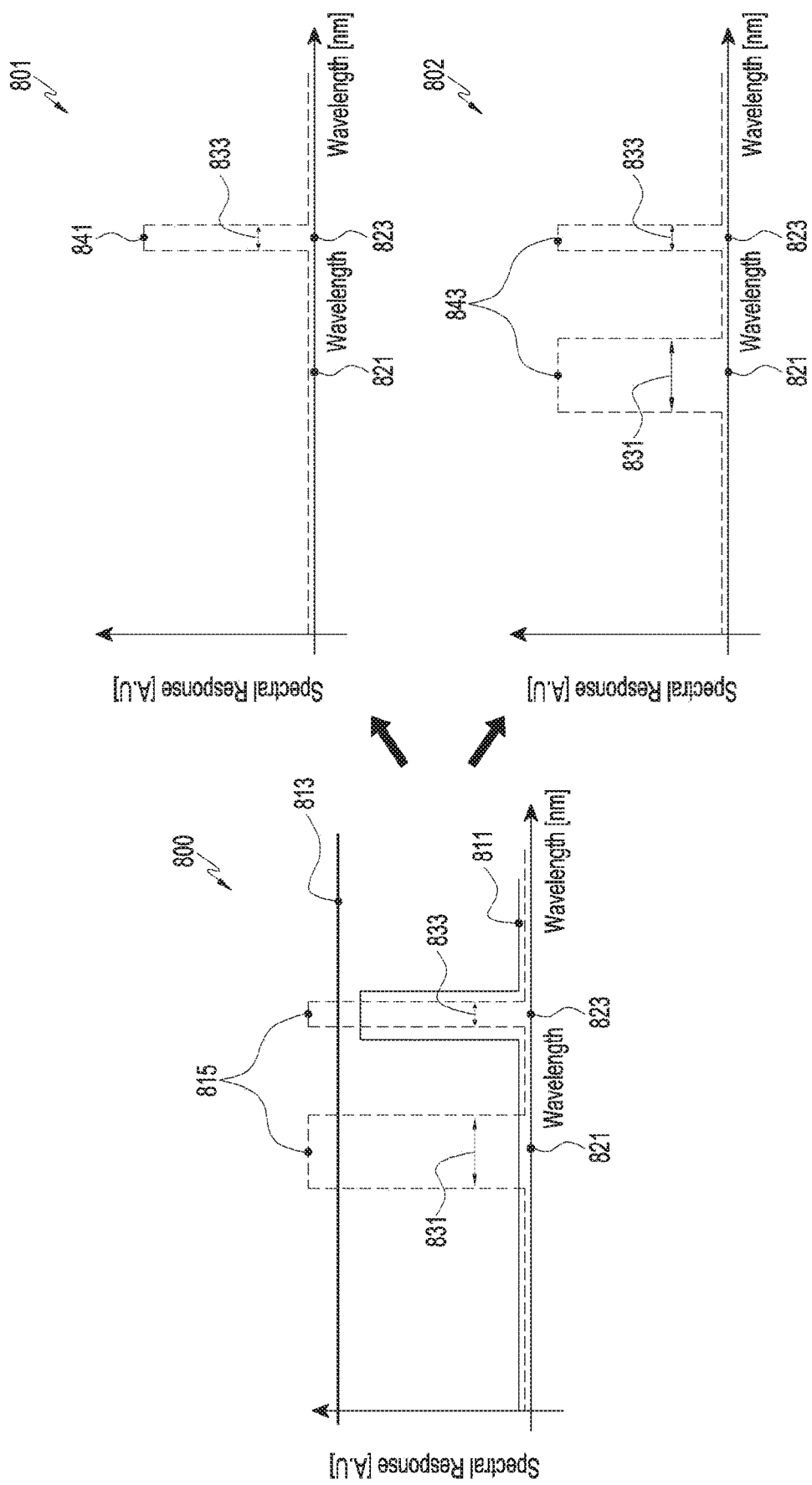
FIGS. 8A and 8B are diagrams illustrating a method of detecting light of a specific band using the image sensor of the electronic device according to various embodiments.
Figure 8B:
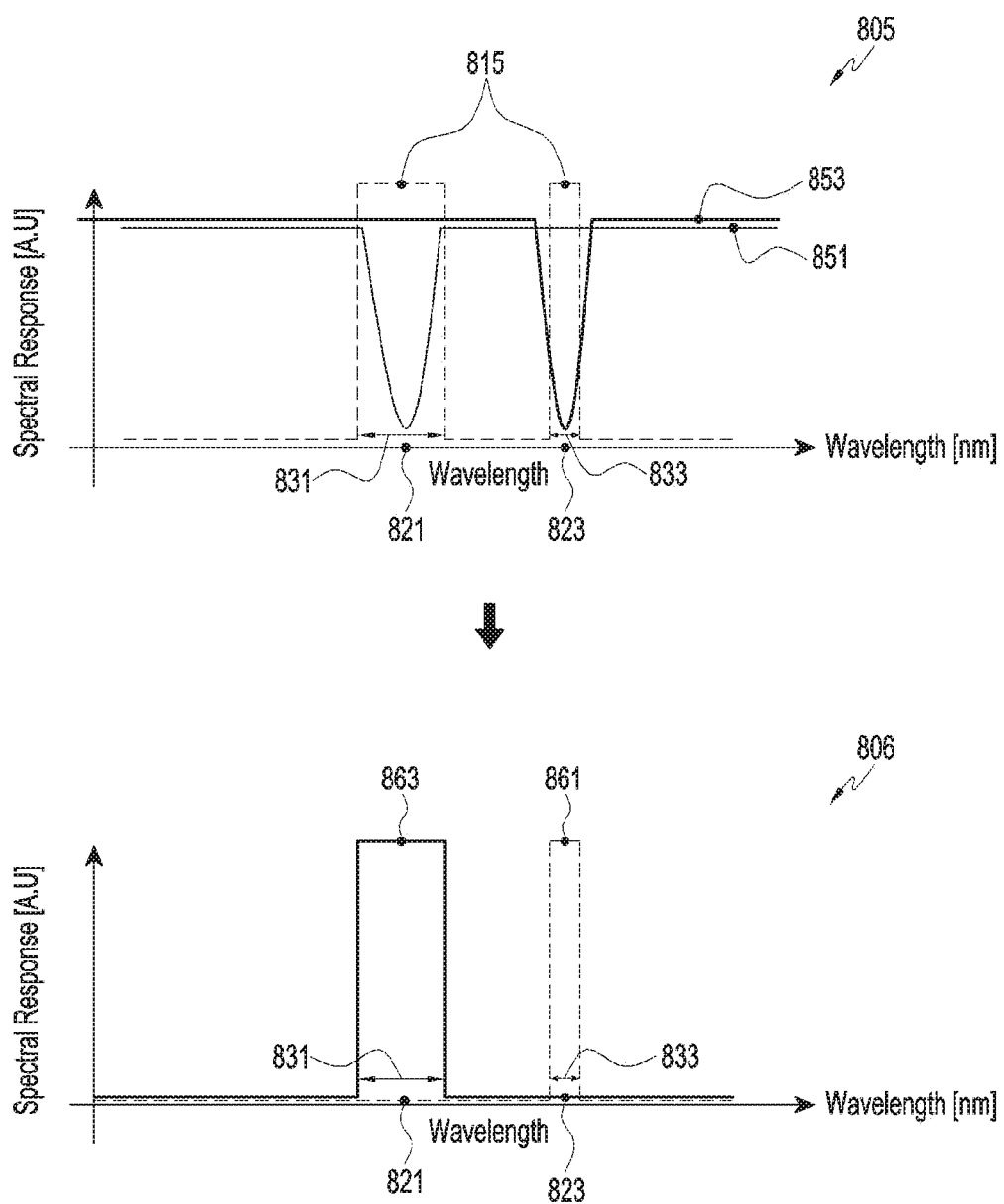

FIGS. 8A and 8B are diagrams illustrating a method of detecting light of a specific band using the image sensor of the electronic device according to various embodiments.

According to an embodiment, the filter 310, which can pass only the light of the first band (e.g., 930 nm to 950 nm) including infrared light 823 having a wavelength of 940 nm and the second band (e.g., 820 nm to 880 nm) including infrared light 821 having a wavelength of 850 nm, may be provided between the lens assembly 210 and the image sensor 230 of the camera module 180. Further, the pixel array 700 of the image sensor 230 may be made up of the first and second pixels 701 and 703.

According to another embodiment, the band pass filter that passes only the light of the first band (e.g., 930 nm to 950 nm) including the infrared light 823 having a wavelength of 940 nm may be provided above the first pixels 701. Further, neither the band pass filter nor the band stop filter may be provided above the second pixels 703. Referring to FIG. 8A, a spectral response 811 of the first pixels 701, a spectral response 813 of the second pixels 703, and a filter section 815 of the filter 310 are illustrated in a graph 800.

For example, the light passing the filter 310 provided between the lens assembly 210 and the image sensor 230 among the light received from the outside via the lens assembly 210 of the camera module 411 may be the light of the first band (e.g., 930 nm to 950 nm) and the light of the second band (e.g., 820 nm to 880 nm). In this case, the light that can be detected via the first pixels 701 among the light passing the filter 310 may be light of a first band 833 (e.g., 930 nm to 950 nm). Further, the light that can be detected via the second pixels 703 among the light passing the filter 310 may be the light of the first band 833 (e.g., 930 nm to 950 nm) and light of a second band 831 (e.g., 820 nm to 880 nm).

In this regard, a spectral response 841 representing a range that can be detected by the first pixels 701 is illustrated in a graph 801. Further, a spectral response 843 representing a range that can be detected by the second pixels 703 is illustrated in a graph 802.

According to yet another embodiment, the band stop filter that can obstruct the light of the second band 831 (e.g., 820 nm to 880 nm) including the infrared light 821 having a wavelength of 850 nm may be provided above the first pixels 701. Further, the band stop filter that can obstruct the light of the first band 833 (e.g., 930 nm to 950 nm) including the infrared light 823 having a wavelength of 940 nm may be provided above the second pixels 703. Referring to FIG. 8A, a spectral response 851 of the first pixels 701, a spectral response 853 of the second pixels 703, and a filter section 815 of the filter 310 are illustrated in a graph 805.

For example, the light passing the filter 310 provided between the lens assembly 210 and the image sensor 230 among the light received from the outside via the lens assembly 210 of the camera module 411 may be the light of the first band (e.g., 930 nm to 950 nm) and the light of the second band (e.g., 820 nm to 880 nm). In this case, the light that can be detected via the first pixels 701 among the light passing the filter 310 may be the light of the first band 833 (e.g., 930 nm to 950 nm). Further, the light that can be detected via the second pixels 703 among the light passing the filter 310 may be the light of the second band 831 (e.g., 820 nm to 880 nm). A spectral response 861 representing a range that can be detected by the first pixels 701 and a spectral response 863 representing a range that can be detected by the second pixels 703 is illustrated in a graph 806.

Figure 9A:
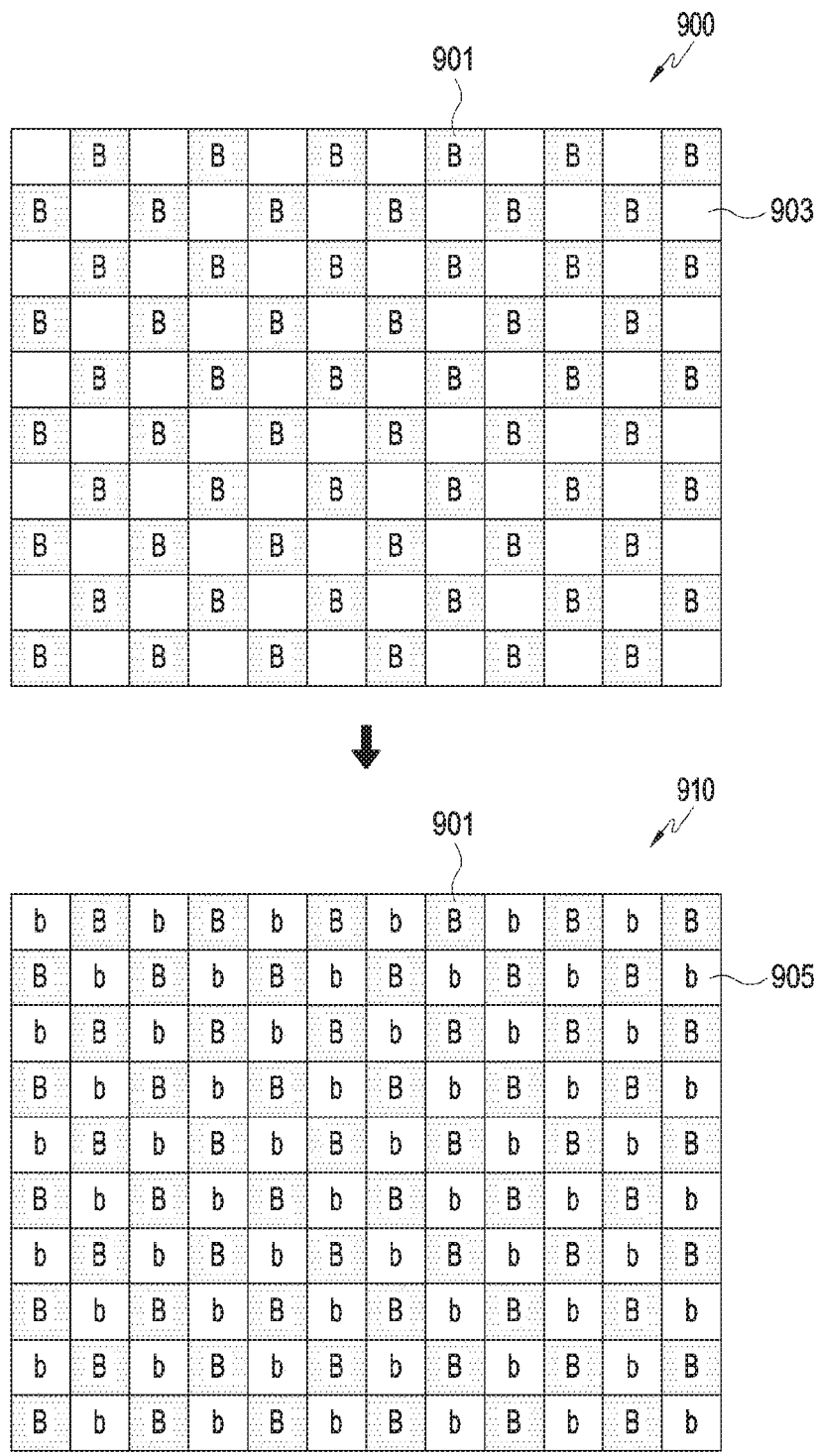
Figure 9B:
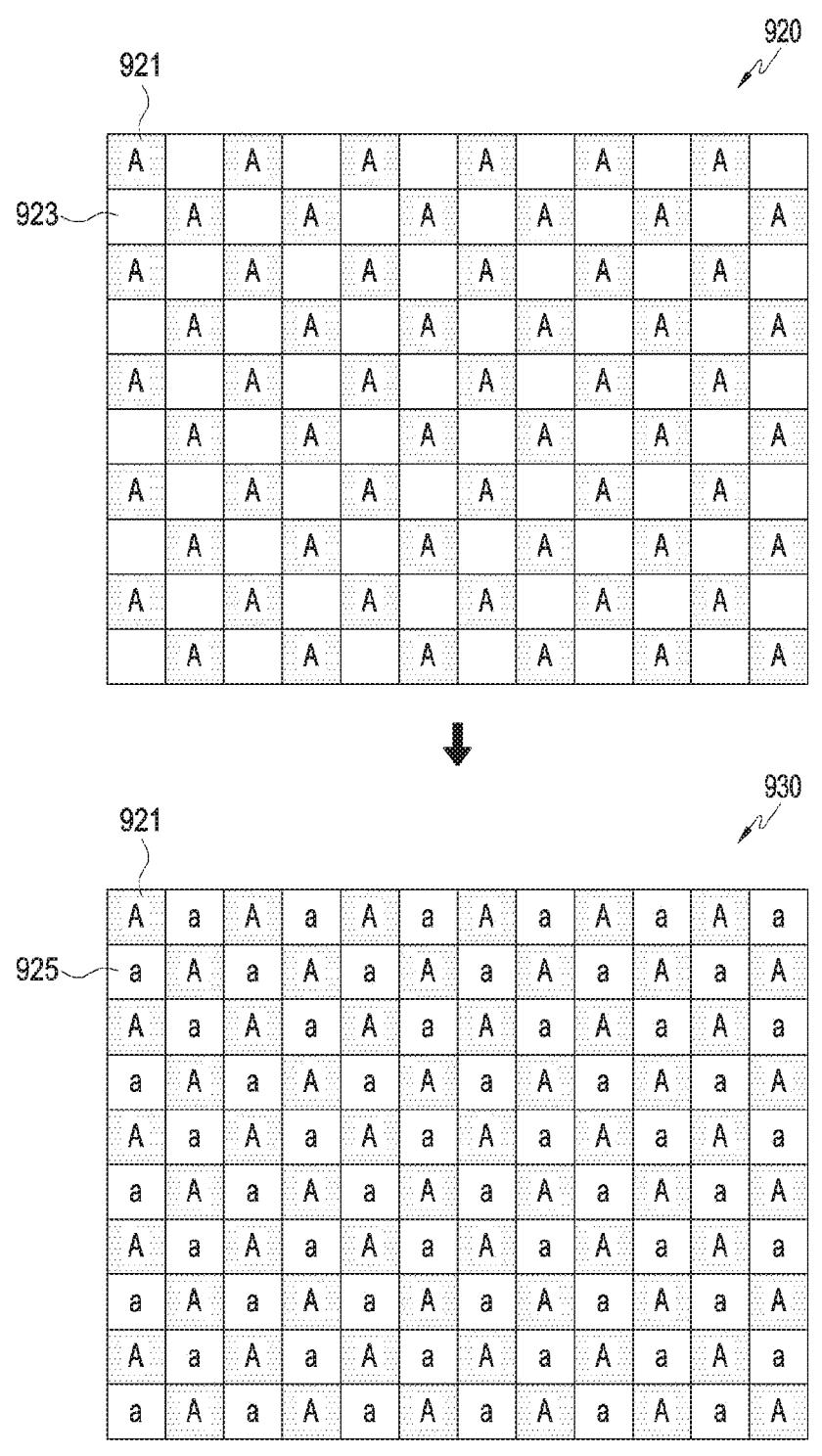

FIGS. 9A and 9B are diagrams illustrating a method of obtaining a high-resolution image using the image sensor of the electronic device according to various embodiments.

According to an embodiment, if the electronic device 101 needs to obtain a high-resolution image as in iris recognition, the electronic device 101 may obtain an image using all data obtained via second pixels 901 included in the image sensor 230. Further, the electronic device 101 may further increase a resolution of the obtained image using surrounding pixels of each of the second pixels 901, for example, data obtained via first pixels 903.

Referring to FIG. 9A, pixel arrays 900 and 910 may be each made up of second pixels 901 that can detect infrared light having a wavelength of 850 nm which is used to recognize the iris of a user, and first pixels 903 that can detect infrared light other than the infrared light having a wavelength of 850 nm.

According to an embodiment, if it is determined that an authentication application is in execution in the electronic device 101 (e.g., the second mode of FIG. 5), the electronic device 101 may obtain at least one type of data via the second pixels 901 that can detect the infrared light having a wavelength of 850 nm which is used to recognize the iris of the user. Further, the electronic device 101 may obtain an iris image using the obtained at least one type of data.

According to another embodiment, the electronic device 101 may obtain an iris image using at least one type of data obtained via the first pixels 903 other than the second pixels 901. For example, the electronic device 101 may perform interpolation computation on the at least one type of data obtained via the first pixels 903 using the at least one type of data obtained via the second pixels 901. Thereby, the electronic device 101 may further obtain at least one type of data 905 on which the interpolation computation is performed. The electronic device 101 uses the data 905 on which the interpolation computation is performed along with the at least one type of data obtained via the second pixels 901, and thereby can obtain an image having a higher resolution, compared to when only the at least one type of data obtained via the second pixels 901 is used.

Meanwhile, if the electronic device 101 is located in a room or a dark place, the electronic device 101 may not obtain a sufficient quantity of light required to capture a subject. For example, the electronic device 101 located in a room or a dark place is very likely to obtain an image having a relatively lower resolution than the electronic device 101 located outside a room or in a bright place. If it is determined that the electronic device 101 according to an embodiment is located in a room or a dark place, the electronic device 101 may obtain an image using all the data obtained via the first pixels 903 included in the image sensor 230. Further, the electronic device 101 may further increase a resolution of the obtained image using surrounding pixels of each of the first pixels 903, for example, data obtained via the second pixels 901.

Referring to FIG. 9B, pixel arrays 920 and 930 may be each made up of first pixels 921 that can detect infrared light having a wavelength of 940 nm which is used to obtain depth information, and second pixels 923 that can detect infrared light other than the infrared light having a wavelength of 940 nm.

According to an embodiment, if it is determined that a depth camera application is in execution in the electronic device 101 (e.g., the first mode of FIG. 5), the electronic device 101 may obtain at least one type of data via the first pixels 921 that can detect the infrared light having a wavelength of 940 nm which is used to obtain the depth information. Further, the electronic device 101 may obtain depth information about a subject using the obtained at least one type of data.

According to another embodiment, the electronic device 101 may obtain an image of the subject using the at least one type of data obtained via the second pixels 923 other than the first pixels 921. For example, the electronic device 101 may perform interpolation computation on the at least one type of data obtained via the second pixels 923 using the at least one type of data obtained via the first pixels 921. Thereby, the electronic device 101 may further obtain at least one type of data 925 on which the interpolation computation is performed. The electronic device 101 uses the data 925 on which the interpolation computation is performed along with the at least one type of data obtained via the first pixels 921, and thereby can obtain an image having a higher resolution, compared to when only the at least one type of data obtained via the first pixels 921 is used.

Figure 10:
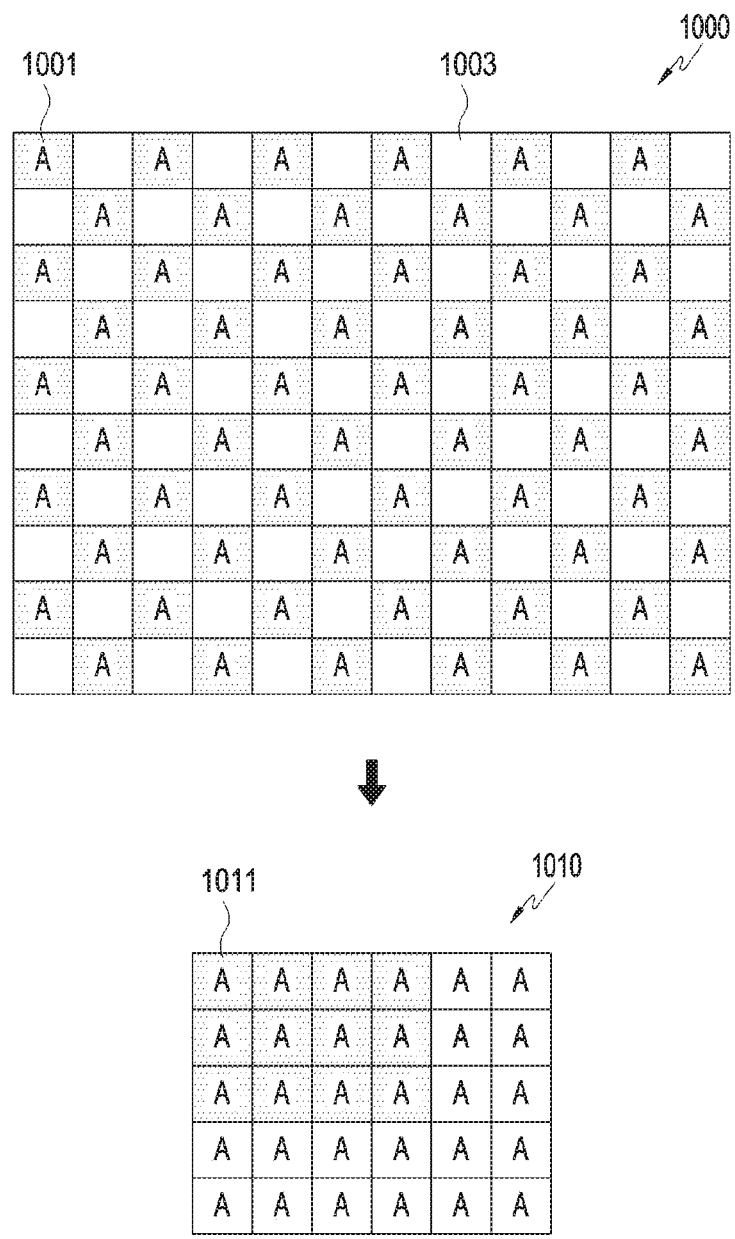
FIG. 10 is a diagram illustrating a method of obtaining a high-sensitivity image and a method of obtaining an image at a high speed using the image sensor of the electronic device according to various embodiments.
Figure 11E:
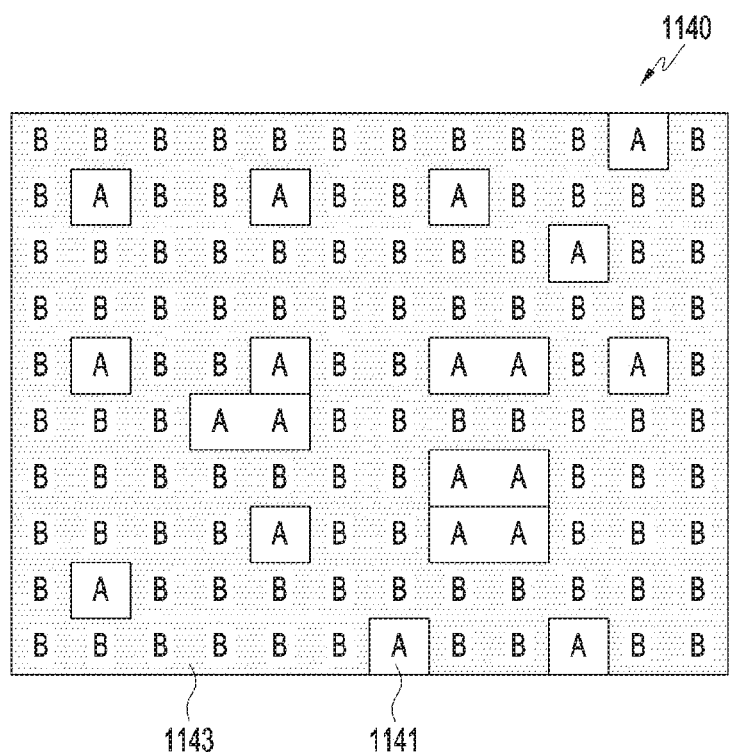
Figure 11F:
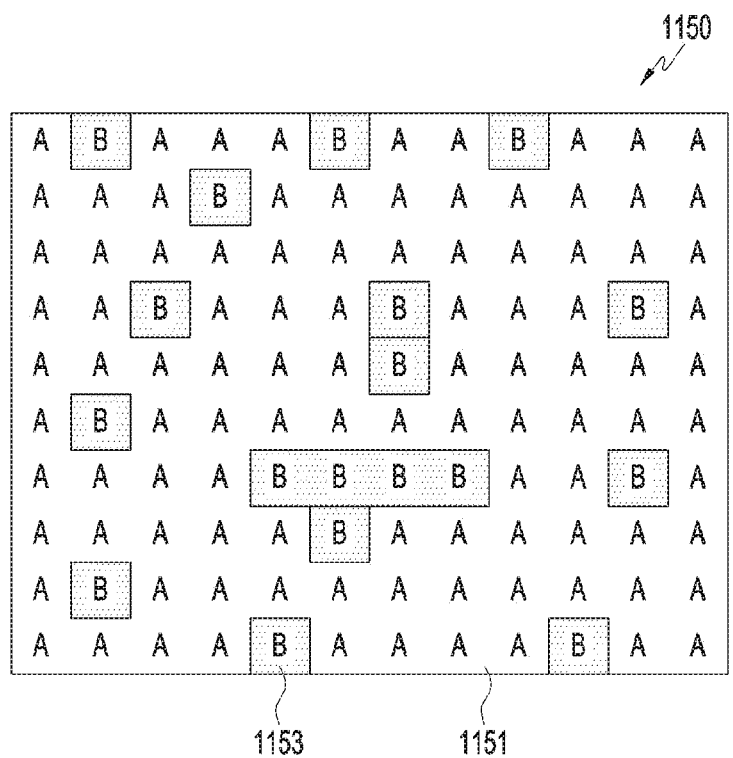

FIG. 10 is a diagram illustrating a method of obtaining a high-sensitivity image and a method of obtaining an image at a high speed using the image sensor of the electronic device according to various embodiments.

The electronic device 101 according to an embodiment may perform a binning operation that compresses data by discarding data obtained via at least some pixels (e.g., first and second pixels 1001 and 1003) constituting a pixel array 1000 or by adding the data and other data for the purpose of increasing a sensitivity of the image sensor and improving an output rate of the image sensor. In other words, binning may refer to a process of compressing data by discarding some of the data obtained via all the pixels or by adding some of the data and other data if a resolution of a desired image can be implemented with only some of all the pixels of the image sensor.

Referring to FIG. 10, the pixel array 1000 may be made up of first pixels 1001 that can detect infrared light having a wavelength of 940 nm which is used to obtain depth information from a subject, and second pixels 1003 that can detect infrared light other than the infrared light having a wavelength of 940 nm.

According to an embodiment, if it is determined that a depth camera application is in execution in the electronic device 101 (e.g., the first mode of FIG. 5), the electronic device 101 may obtain at least one type of data via the first pixels 1001 that can detect the infrared light having a wavelength of 940 nm which is used to obtain the depth information. For example, the electronic device 101 may discard data obtained via the second pixels 1003 that cannot detect the infrared light having a wavelength of 940 nm among the data obtained via the pixel array 1000. Further, the electronic device 101 may add the data, which is obtained via the second pixels 1003 that cannot detect the infrared light having a wavelength of 940 nm among the data obtained via the pixel array 1000, and data obtained via the first pixels 1001. In this way, the electronic device 101 performs binning on the data obtained via the pixel array 1000, and thereby can obtain compressed data 1010. The electronic device 101 obtains the depth information using only first data 1011 that is some of the compressed data 1010, and thereby can improve the output rate of the image sensor 230. Further, the electronic device 101 obtains the depth information using all the compressed data 1010, and thereby can increase the sensitivity of the image sensor 230.

FIGS. 11A to 11F are diagrams illustrating a structure of the pixel array included in the image sensor of the electronic device according to various embodiments.

According to another embodiment, pixel arrays 1100, 1110, 1120, 1130, 1140, and 1150, each of which is included in the image sensor 230 of the electronic device 101, may be each configured in various ways. For example, the pixel array 1100 may be configured in such a way that first pixels 1101 are located inside the pixel array 1100 and second pixels 1103 are located outside the first pixels 1101. Further, the pixel array 1110 may be configured in such a way that the first pixels 1111 are located at one half of the pixel array 1110 and the second pixels 1113 are located at the other half of the pixel array 1110. Further, the pixel arrays 1120 and 1130 may be configured in such a way that lines made up of first pixels 1121 and 1131 and lines made up of second pixels 1123 and 1133 are alternately arranged. Further, the pixel arrays 1140 and 1150 may be configured in such a way that first pixels 1141 and 1151 and second pixels 1143 and 1153 are disposed pseudo-randomly.

Figure 12A:
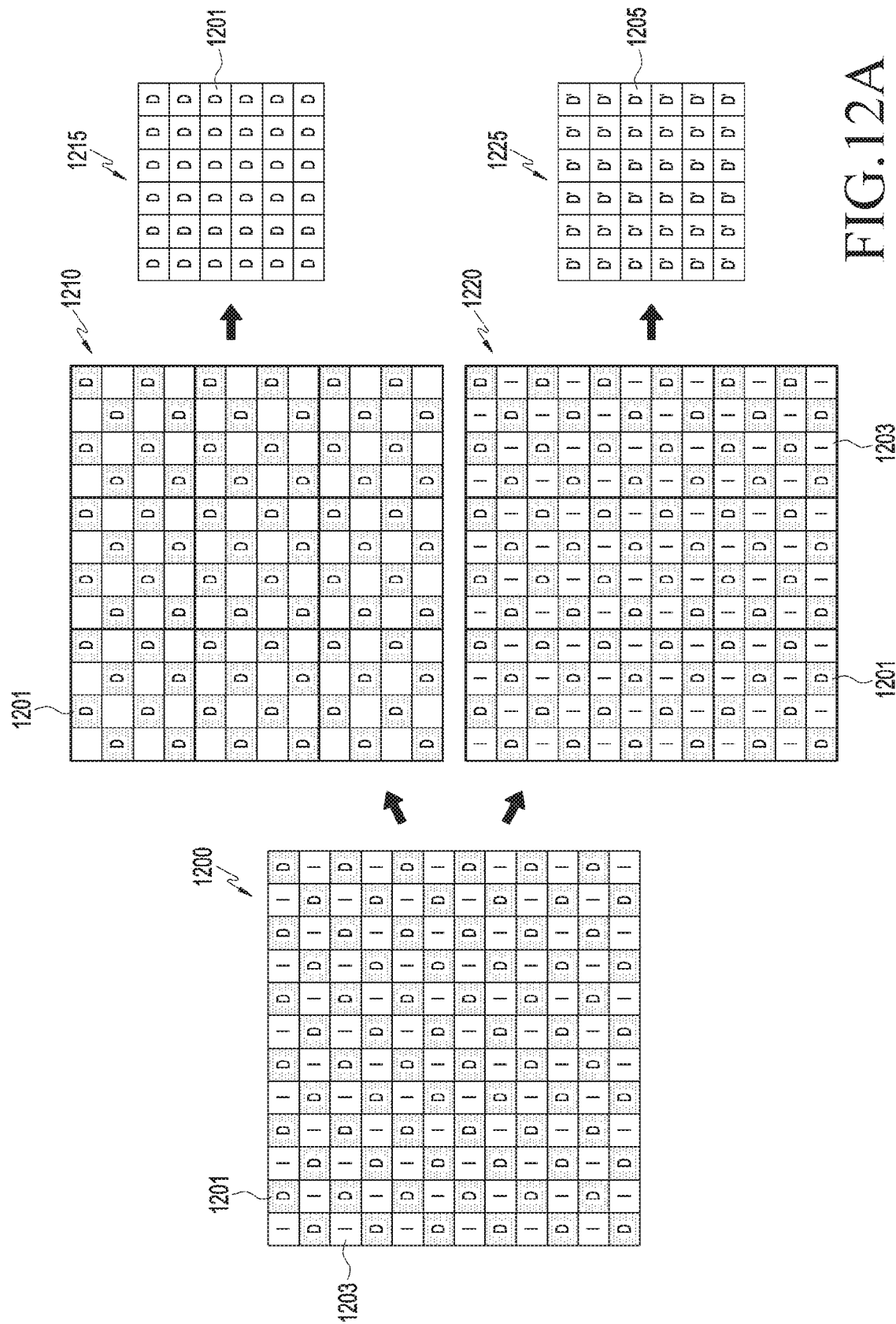
FIGS. 12A and 12B are diagrams illustrating a method of using the image sensor of the electronic device according to various embodiments.
Figure 12B:
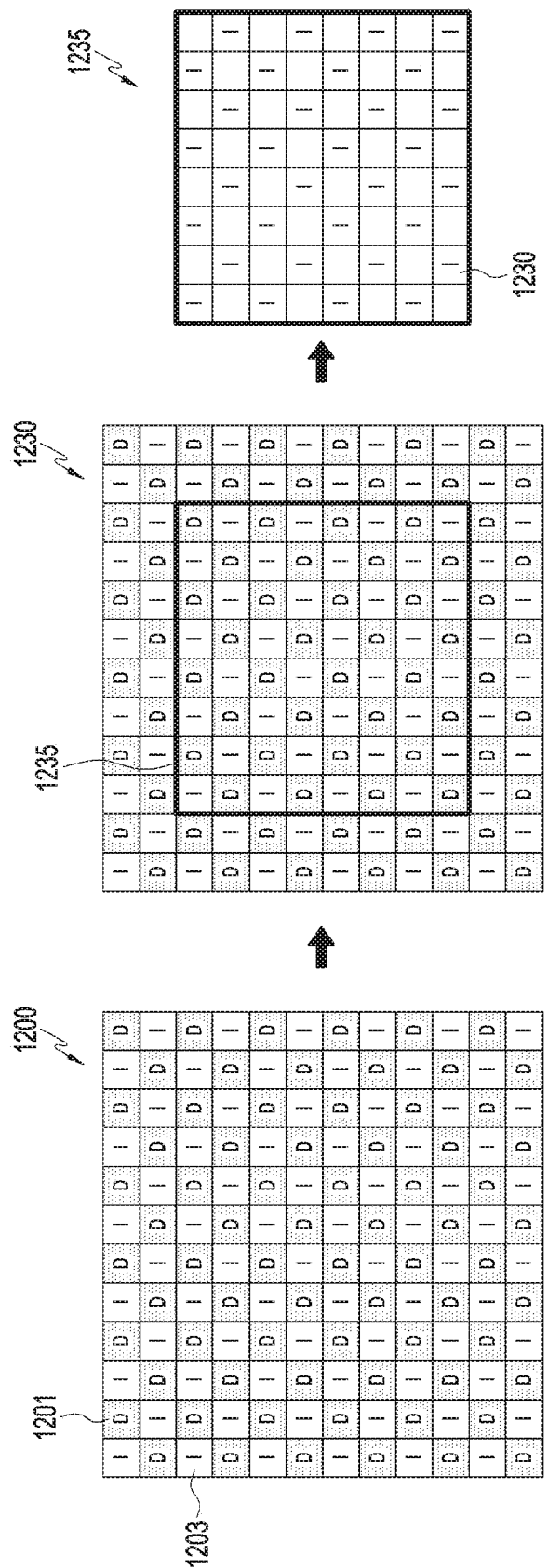

FIGS. 12A and 12B are diagrams illustrating a method of using the image sensor of the electronic device according to various embodiments.

FIG. 12A is a diagram illustrating a method of obtaining a high-sensitivity image or a high-resolution image in consideration of a position or an ambient environment of the electronic device according to various embodiments.

The electronic device 101 according to an embodiment may perform a binning operation that compresses data by discarding data obtained via at least some pixels (e.g., first and second pixels 1201 and 1203) constituting a pixel array 1200 or by adding the data and other data for the purpose of increasing a sensitivity of the image sensor and improving an output rate of the image sensor. In other words, binning may refer to a process of compressing data by discarding some of the data obtained via all the pixels or by adding some of the data and other data if a resolution of a desired image can be implemented with only some of all the pixels of the image sensor.

For example, if the electronic device 101 is located in a place (e.g., outside a room during daytime hours) where light is sufficiently supplied, a sufficient quantity of light may be transferred to the first and second pixels 1201 and 1203. In this case, the electronic device 101 may produce an image using only data obtained via at least one of the first pixels 1201 and the second pixels 1203. That is, if the electronic device 101 is located in a place where light is sufficiently supplied, the electronic device 101 may perform the binning operation to increase the sensitivity of the image sensor and to improve the output rate of the image sensor.

For example, if a band pass filter passing only light of a first band (e.g., 930 nm to 950 nm) including infrared light having a wavelength of 940 nm is provided above the first pixels 1201, a sufficient quantity of the infrared light having a wavelength of 940 nm may be supplied to the first pixels 1201. Thus, if depth information is obtained using the infrared light having a wavelength of 940 nm, the electronic device 101 located in a place where light is sufficiently supplied may produce an image using only the data obtained via the first pixels 1201 of the pixel array 1200. That is, the electronic device 101 located in a place where light is sufficiently supplied may perform the binning operation that discards the data obtained via the second pixels 1203 in order to produce the image using only the data obtained via the first pixels 1201.

Meanwhile, if no filters excluding the filter 310 that passes the light of the first band (e.g., 930 nm to 950 nm) and the second band (e.g., 820 nm to 880 nm) are provided above the second pixels 1203, a sufficient quantity of the infrared light having wavelengths of 940 nm and 850 nm may be supplied to the second pixels 1203. In this case, a sufficient quantity of the infrared light having a wavelength of 850 nm which is supplied to the second pixels along with the infrared light having a wavelength of 940 nm may serve as noise in obtaining the depth information using the infrared light having a wavelength of 940 nm in the electronic device 101. For this reason, the electronic device 101 may produce an image using only the data obtained via the first pixels 1201, and perform the binning operation that discards the data obtained via the second pixels 1203.

If the binning operation is performed in the electronic device 101, the data obtained via the second pixels 1203 may be discarded as in the pixel array 1210. As a result, the electronic device 101 may obtain an image 1215 based on the data obtained via the first pixels 1201.

The electronic device 101 according to an embodiment may perform interpolation computation that corrects data obtained via a specific pixel on the basis of data obtained via at least one pixel located around the specific pixel for the purpose of obtaining the high-resolution image.

For example, if the electronic device 101 is located in a place (e.g., inside a room or outside a room during nighttime hours) where light is insufficiently supplied, a sufficient quantity of light may not be transferred to the first and second pixels 1201 and 1203. In this case, the electronic device 101 may obtain the high-resolution image by correcting the data obtained via the first pixels 1201 or the second pixels 1203 using the data obtained via the second pixels 1203 or the first pixels 1201. That is, if the electronic device 101 is located in a place where light is insufficiently supplied, the electronic device 101 may achieve an effect of performing the interpolation computation to increase the resolution of the image sensor.

For example, if the band pass filter that passes only the light of the first band (e.g., 930 nm to 950 nm) including the infrared light having a wavelength of 940 nm is provided above the first pixels 1201, the infrared light having a wavelength of 940 nm may be supplied to the first pixels 1201. Further, if no filters excluding the filter 310 that passes the light of the first band (e.g., 930 nm to 950 nm) and the second band (e.g., 820 nm to 880 nm) are provided above the second pixels 1203, the infrared light having wavelengths of 940 nm and 850 nm may be supplied to the second pixels 1203.

If the depth information is obtained using the infrared light having a wavelength of 940 nm, the electronic device 101 located in a place where light is insufficiently supplied may correct the data obtained via the first pixels 1201 using the data obtained via the second pixels 1203 of the pixel array 1200. That is, the electronic device 101 located in a place where light is insufficiently supplied may perform the interpolation computation that corrects the data obtained via the first pixels 1201 using the data obtained via the second pixels 1203 in order to produce an image having a higher resolution compared to when it produces an image using only the data obtained via the first pixels 1201.

If the interpolation computation is performed in the electronic device 101, operations such as combination, compression, and editing between the data obtained via the first pixels 1201 and the data obtained via the second pixels 1203 as in the pixel array 1220 may be performed. As a result, the electronic device 101 may obtain an image 1225 based on the data 1205 on which the interpolation computation is performed.

FIG. 12B is a diagram illustrating a method of rapidly performing iris recognition using the electronic device according to various embodiments.

The electronic device 101 according to an embodiment may crop at least some pixels 1235 required to recognize the iris of a user among pixels (e.g., first and second pixels 1201 and 1203) constituting a pixel array 1200 or 1230.

Further, for the purpose of increasing the sensitivity of the image sensor and improving the output rate of the image sensor, the electronic device 101 may perform the binning operation that compresses data by discarding data obtained via at least some of the cropped pixels 1235 or by adding the data and other data. As a result, the electronic device 101 may obtain at least one type of data via the second pixels 1203 that can detect infrared light having a wavelength of 850 nm used to recognize the iris of the user. Further, the electronic device 101 may obtain an iris image using the obtained at least one type of data.

In a method of obtaining data using an electronic device according to various embodiments, the method may include: a process of checking a mode related to capturing of an external object of the electronic device that includes at least one lens, and an image sensor that includes a first filter configured to pass light of an infrared band among light obtained via the at least one lens, first pixels that are configured to be able to detect light of at least a first band corresponding to some of the light of the infrared band passing the first filter, second pixels that are configured to be able to detect light of at least a second band corresponding to the other of the light of the infrared band passing the first filter, and a second filter that reduces electrical reactivity of the first pixels to light of a band other than the first band and is provided above the first pixels; a process of obtaining first data that corresponds to the external object using at least the first pixels on the basis of the fact that the identified mode is a first mode; and a process of obtaining second data that corresponds to the external object using at least the second pixels on the basis of the fact that the identified mode is a second mode.

In a computer-readable recording medium recorded with a program for executing a method of obtaining data using an electronic device according to various embodiments, the method may include: a process of checking a mode related to capturing of an external object of the electronic device that includes at least one lens, and an image sensor that includes a first filter configured to pass light of an infrared band among light obtained via the at least one lens, first pixels that are configured to be able to detect light of at least a first band corresponding to some of the light of the infrared band passing the first filter, second pixels that are configured to be able to detect light of at least a second band corresponding to the other of the light of the infrared band passing the first filter, and a second filter that reduces electrical reactivity of the first pixels to light of a band other than the first band and is provided above the first pixels; a process of obtaining first data that corresponds to the external object using at least the first pixels on the basis of the fact that the identified mode is a first mode; and a process of obtaining second data that corresponds to the external object using at least the second pixels on the basis of the fact that the identified mode is a second mode.

The invention claimed is:

1. A camera module comprising:
an image sensor comprising a first filter configured to pass light of an infrared band, a pixel array configured to include first pixels configured to be able to detect light of at least a first band corresponding to some of the light of the infrared band passing the first filter, and second pixels configured to be able to detect light of at least a second band corresponding to the other of the light of the infrared band passing the first filter, and a second filter configured to reduce electrical reactivity of the first pixels to light of a band other than the first band, and provided above the first pixels; and
a processor configured to:
identify a mode related to capturing an image of an external object,
if the identified mode is a first mode, obtain first data that corresponds to the external object using at least the first pixels, and
if the identified mode is a second mode, obtain second data that corresponds to the external object using at least the second pixels,
wherein if the identified mode is the first mode, the processor is further configured to:
obtain third data that corresponds to the external object using the second pixels,
perform interpolation computation on the obtained first data on the basis of the obtained third data, and
obtain information related to the external object using the obtained third data and the first data on which the interpolation computation is performed.

2. The camera module of claim 1, wherein:
the first filter includes at least one band pass filter; and
the at least one band pass filter is configured to reduce electrical reactivity of the first and second pixels to light of a band other than the first band or the second band.

3. The camera module of claim 1, wherein the second filter includes a band pass filter that passes the light of the first band, or a band stop filter that obstructs the light of the second band.

4. The camera module of claim 1, wherein:
the first band includes infrared light having a wavelength of 940 nm; and
the second band includes infrared light having a wavelength of 850 nm.

5. The camera module of claim 1, further comprising a third filter configured to reduce electrical reactivity of the second pixels to light of a band other than the second band, and provided above the second pixels.

6. The camera module of claim 5, wherein the third filter includes a band pass filter that passes the light of the second band, or a band stop filter that obstructs the light of the first band.

7. The camera module of claim 1, wherein:
the first mode is a mode for obtaining depth information related to at least one object on the basis of the obtained first data; and
the second mode is a mode for obtaining iris information related to at least one object on the basis of the obtained second data.

8. The camera module of claim 1, wherein:
the pixel array is provided on the image sensor in a grid shape; and
the first pixels and the second pixels are alternately disposed at the grid-shaped pixel array.

9. An electronic device comprising:
at least one lens;
a first filter configured to pass light of an infrared band among light obtained via the at least one lens;
an image sensor comprising first pixels configured to be able to detect light of at least a first band corresponding to some of the light of the infrared band passing the first filter, second pixels configured to be able to detect light of at least a second band corresponding to the other of the light of the infrared band passing the first filter, and a second filter configured to reduce electrical reactivity of the first pixels to light of a band other than the first band, and provided above the first pixels; and
a processor electrically connected to the image sensor, wherein the processor is configured to:
identify a mode related to capturing an image of an external object,
if the identified mode is a first mode, obtain first data that corresponds to the external object using at least the first pixels, and
if the identified mode is a second mode, obtain second data that corresponds to the external object using at least the second pixels, and
wherein if the identified mode is the first mode, the processor is further configured to:
obtain third data that corresponds to the external object using the second pixels,
perform interpolation computation on the obtained first data on the basis of the obtained third data, and
obtain information related to the external object using the obtained third data and the first data on which the interpolation computation is performed.

10. The electronic device of claim 9, wherein:
the first filter includes at least one band pass filter, and
the at least one band pass filter is configured to reduce electrical reactivity of the first and second pixels to light of a band other than the first or second band.

11. The electronic device of claim 10, wherein the processor is configured to
encode the obtained second data, and
obtain information related to the external object using the encoded second data.

12. The electronic device of claim 9, wherein the processor is configured to
perform pixel binning on the obtained first or second data, and
obtain information related to the external object using the first or second data on which the pixel binning is performed.

13. The electronic device of claim 9, wherein the processor is configured to
obtain fourth data that corresponds to the external object using the first pixels on the basis of the fact that the identified mode is the second mode,
perform interpolation computation on the obtained second data on the basis of the obtained fourth data, and
obtain information related to the external object using the obtained fourth data and the second data on which the interpolation computation is performed.

* * * * *